(12) United States Patent
Ren et al.

(10) Patent No.: US 9,099,601 B2
(45) Date of Patent: Aug. 4, 2015

(54) THERMOELECTRIC MATERIALS AND METHODS FOR SYNTHESIS THEREOF

(71) Applicants: Zhifeng Ren, Newton, MA (US); Qinyong Zhang, Chengdu (CN); Qian Zhang, Chestnut Hill, MA (US); Gang Chen, Carlisle, MA (US)

(72) Inventors: Zhifeng Ren, Newton, MA (US); Qinyong Zhang, Chengdu (CN); Qian Zhang, Chestnut Hill, MA (US); Gang Chen, Carlisle, MA (US)

(73) Assignees: The Trustees of Boston College, Chestnut Hill, MA (US); Massachusetts Institute of Technology, Cambridge, MA (US)

( * ) Notice: Subject to any disclaimer, the term of this patent is extended or adjusted under 35 U.S.C. 154(b) by 118 days.

(21) Appl. No.: 13/799,498

(22) Filed: Mar. 13, 2013

(65) Prior Publication Data
US 2013/0256609 A1    Oct. 3, 2013

Related U.S. Application Data

(60) Provisional application No. 61/617,344, filed on Mar. 29, 2012.

(51) Int. Cl.
 *H01L 35/16* (2006.01)
 *H01L 35/34* (2006.01)
 *C01B 19/00* (2006.01)

(52) U.S. Cl.
 CPC ............. *H01L 35/16* (2013.01); *C01B 19/002* (2013.01); *H01L 35/34* (2013.01); *C01P 2002/50* (2013.01); *C01P 2002/72* (2013.01); *C01P 2004/03* (2013.01); *C01P 2004/04* (2013.01); *C01P 2006/40* (2013.01)

(58) Field of Classification Search
 USPC ............................... 252/62.3 T; 423/508, 509
 See application file for complete search history.

(56) References Cited

U.S. PATENT DOCUMENTS

| | | | |
|---|---|---|---|
| 2,957,937 A | 10/1960 | Jensen et al. | |
| 3,228,805 A | 1/1966 | Waseleski et al. | |
| 4,717,788 A * | 1/1988 | Rauch et al. .................. | 136/237 |
| 7,255,846 B2 * | 8/2007 | Ren et al. ...................... | 423/508 |
| 2008/0202575 A1 | 8/2008 | Ren et al. | |
| 2009/0178700 A1 * | 7/2009 | Heremans et al. ............. | 136/201 |
| 2011/0248209 A1 * | 10/2011 | Androulakis et al. .......... | 252/71 |
| 2012/0097906 A1 * | 4/2012 | Snyder et al. ............. | 252/519.14 |

OTHER PUBLICATIONS

Heremans et al, "Enhancement of Thermoelectric Efficiency in PbTe by Distortion of the Electronic Density of States", Science, vol. 321, Jul. 2008, pp. 554-557.*
Pei et al, "High thermoelectric figure of merit in heavy hle dominated PbTe", Energy and Environmental Science, 4, pub online Jan. 2011, pp. 2085-2089.*

(Continued)

*Primary Examiner* — Carol M Koslow
(74) *Attorney, Agent, or Firm* — Greenberg Traurig, LLP; David J. Dykeman; Roman Fayerberg

(57) ABSTRACT

Materials having improved thermoelectric properties are disclosed. In some embodiments, lead telluride/selenide based materials with improved figure of merit and mechanical properties are disclosed. In some embodiments, the lead telluride/selenide based materials of the present disclosure are p-type thermoelectric materials formed by adding sodium (Na), silicon (Si) or both to thallium doped lead telluride materials. In some embodiments, the lead telluride/selenide based materials are formed by doping lead telluride/selenides with potassium.

7 Claims, 40 Drawing Sheets

(56) References Cited

OTHER PUBLICATIONS

Alekseeva (G. T. Alekseeva, B. G. Zemskov, P. P. Konstantinov, L. V. Prokofeva, K. T. Urazbaeva, Row of Defects in Acceptor Doping of PbTe-Type Semiconductors with Group I Elements, Soviet Physics Semiconductors, USSR, 1992, 26(2), 202-207.).

Jaworski (C. M. Jaworski, B. Wiendlocha, V. Jovovic, J. P. Heremans, Combining alloy scattering of phonons and resonant electronic levels to reach a high thermoelectric figure of merit in PbTeSe and PbTeS alloys, Energy & Environmental Science, 2011, 4(10), 4155-4162.).

Sootsman (J. R. Sootsman, J. Q. He, V. P. Dravid, S. Ballikaya, D. Vermeulen, C. Uher, M. G. Kanatzidis, Microstructure and Thermoelectric Properties of Mechanically Robust PbTe—Si Eutectic Composites, Chemistry of Materials, 2010, 22(3), 869-875.).

Khokhlov, D. Lead Chalcogenides Physics and Applications; Taylor & Francis Books; New York & London, 2003, p. 428-445.

Pei, Y.; Shi, X.; LaLonde, A.; Wang, H.; Chen, L.; Snyder, G. J., Convergence of Electronic Bands for High Performance Bulk Thermoelectrics, Nature, vol. 473, 66-69, May 5, 2011.

Xiong, K.; Lee, G.; Gupta, R. P.; Wang, W.; Gnade, B. E.; Cho, K. J., Behaviour of Group IIIA Impurities in PbTe: Implications to Improve Thermoelectric Efficiency, Phys. D: Appl. Phys., 43, 405403, Sep. 21, 2010.

Ahmad, S.; Mahanti, S. D.; Hoang, K.; Kanatzidis, M. G., Ab initio Studies of the Electronic Structure of Defects in PbTe, Phys. Rev. B, 74, 155205-1-155205-13, Oct. 19, 2006.

Delaire, O.; Ma, J.; Marty, K.; May, A. F.; McGuire, M. A.; Du, M. H.; Singh, D. J.; Podlesnyak, A.; Ehlers, G.; Lumsden, M. D.; Sales, B. C., Giant Anharmonic Phonon Scattering in PbTe, Nature Materials, vol. 10, 614-619, Aug. 2011.

Singh, D. J., Doping-dependent Thermopower of PbTe from Boltzmann Transport Calculations, Phys. Rev. B, 81, 195217-1-195217-6, May 27, 2010.

Disalvo, F. J., Thermoelectric Cooling and Power Generation, Science, vol. 285, 703-706, Jul. 30, 1999.

Kraemer, D.; Poudel, B.; Feng, H. P.; Cavlor, J. C.; Yu, B.; Yan, X.; Ma, Y.; Wang, X. W.; Wang, D. Z.; Muto, A.; McEnaney, K.; Chiesa, M.; Ren, Z. F.; Chen, G., High-performance Flat-panel Solar Thermoelectic Generators with High Thermal Concentration, Nature Materials, vol. 10, 532-538, May 1, 2011.

Harman, T. C.; Taylar, P. J.; Walsh, M. P.; LaForge, B. E., Quantum Dot Superlattice Thermoelectric Materials and Devices, Science, vol. 297, 2229-2232, Sep. 27, 2002.

Yan, X.; Joshi, G.; Liu, W. S.; Lan, Y. C.; Wang, H.; Lee, S.; Simonson, J. M.; Poon, S. J.; Tritt, T. M.; Chen, G.; Ren, Z. F., Enhanced Thermoelectric Figure of Merit of p-Type Half Heuslers, Nano Letters, 11, 556-560, Dec. 22, 2010.

Zhang, Q.; He, J.. Zhu, T. J.; Zhang, S. N.; Zhao, X. B.; Tritt, T. M., High Figures of Merit and Natural Nanostructures in n. Mg 2 Si 0.4 Sn 0.6 based Thermoelectric Materials, Appl. Phys. Lett., 93, 102109-1-102109-3, Sep. 2008.

Poudel, B.; Hao, Q.; Ma, Y.; Lan, Y. C.; Minnich, A.; Yu, B.; Yan, X.; Wang, D. Z.; Muto, A.; Vashaee, D.; Chen, X.; Liu, J.; Dresselhaus, D. S.; Chen, G.; Ren, Z. F., High-Thermoelectic Performance of Nanostructured Bismuth Antimony Telluride Bulk Alloys, Science, vol. 320, 634-638, May 2, 2008.

Sales, B. C.; Mandrus, D.; Williams, R. K., Filled Skutterudite Antimonides: A New Class of Thermoelectric Materials, Science, 272, 1325, May 31, 1996.

Yu, C.; Zhu, T. J.; Zhang, S. N.; Zhao, X. B.; He, J.; Su, Z.; Tritt, T. M. J., Improved Thermoelectric Performance in the Zintl Phase Compounds Yb Zn 2—x Mn x Sb 2 via Isoelectronic Substitution in the Anionic Framework, Appl. Phys., 104, 013705-1, Jul. 2008.

Kleinke, H., New bulk Materials for Thermoelectric Power Generation: Clathrates and Complex Antimonides, Chem. Mater., vol. 22, 604-611, Aug. 25, 2009.

Dresselhaus, M. S.; Chen, G.; Tang, M. Y.; Yang, R. G.; Lee, H.; Wang, D. Z.; Ren, Z. F.; Fleurial, J. P.; Gogna, P., New Directions for Low-Dimensional Thermoelectric Materials, Adv. Mater., vol. 19, 1043-1053, Apr. 20, 2007.

Liu, W. S.; Yan, X.; Chen, G.; Ren, Z. F., Recent advances in Thermoelectric Nanocomposites, Nano Energy, 1, 42-56, Oct. 2011.

Martin, J.; Wang, L.; Chen, L. D.; Nolas, G. S., Enhanced Seebeck Coefficient through Energy-barrier Scattering in PbTe Nanocomposites, Phys. Rev. B, 79, 115311-1-115311-5, Mar. 13, 2009.

Faleev, S. V.; Leonard, F., Theory of Enhancement of Thermoelectric Properties of Materials with Nanoinclusions, Phys. Rev. B, 77, 214304-1-214304-9, Jun. 12, 2008.

Zhang, Q.; Zhang, Q. Y.; Chen, S.; Liu, W. S.; Lukas, K.; Yan, X.; Wang, H. Z.; Wang, D. Z.; Opeil, C.; Chen, G.; Ren, Z. F., Heavy Doping and Band Engineering by Potassium to Improve the Thermoelectric Figure of Merit in p-Type PbTe, PbSe, and PbTe1-ySey, J. Am. Chem. Soc., 134, 10031-10038, May 24, 2012.

Scheele, M.; Oeschler, N.; Meier, K.; Kornowski, A.; linke, C.; Weller, H., Synthesis and Thermoelectric Characterization of Bi2Te3 Nanoparticles, Adv. Funct. Mater., vol. 19, 3476-3483, Nov. 9, 2009.

Zhang, Q.; Sun, T.; Cao, F.; Li, M.; Hong, M. H.; Yuan, J. K.; Yan, Q. Y.; Hng, H. H.; Wu, N. Q.; Liu, X. G., Tuning the Shape and Thermoelectric Property of PbTe Nanocrystals by Bismuth Doping, Nanoscale, 2, 1256-1259, May 19, 2010.

Ahmad, S.; Hoang, K.; Mahanti, S. D., Ab Initio Study of Deep Defect States in Narrow Band-Gap Semiconductors: Group III Impurities in PbTe, Phys. Rev. L, 96, 056403-1-056403-4, Feb. 8, 2006.

Yu, B.; Zhang, Q. Y.; Wang, H.; Wang, X. W.; Wang, H. Z.; Wang, D. Z.; Snyder, G. J.; Chen, G.; Ren, Z. F. J., Thermoelectric Property Studies on Thallium-doped Lead Telluride prepared by Ball Milling and Hot Pressing, Appl. Phys., 108, 016104-1, Jul. 12, 2010.

Parker, D.; Singh, D. J., High-temperature Thermoelectric Performance of Heavily Doped PbSe, Phys. Rev. B, 82, 035204-1-035204-5, Jul. 8, 2010.

LaLonde, A. D.; Pei, Y. Z.; Snyder, G. J., Reevaluation of PbTe1-xIx as High Performance n-type Thermoelectric Material, Energy Environ. Sci., 4, 2090-2096, Apr. 2011.

Wang, H.; Pei, Y.; LaLonde, A. D.; Snyder, G. J., Heavily Doped p-Type PbSe with High Thermoelectric Performance: An Alternative for PbTe, Adv. Mater., 23, 1366-1370, Feb. 10, 2011.

Zhang, Q. Y.; Wang, H.; Liu, W. S.; Wang, H. Z.; Yu, B.; Zhang, Q.; Tian, Z. T.; Ni, G.; Lee, S.; Esfarjani, K.; Chen, G.; Ren, Z. F., Enhancement of Thermoelectric Figure-of-merit by Resonant States of Aluminium Doping in Lead Selenide, Energy Environ. Sci., 5, 5246-5251, Oct. 2011.

Androulakis, J.; lee, Y.; Todorov, I.; Chung, D. Y.; Kanatzidis, M., High-temperature Thermoelectric Properties of n-type PbSe Doped with Ga, In, and Pb, Phys. Rev. B, 83, 195209-1-195209-9, May 31, 2011.

Androulakis, J.; Todorov, I.; Chung, D. Y.; Ballikaya, S.; Wang, G.; Uher, C.; Kanatzidis, M., Thermoelectric Enhancement in PbTe with K or Na Codoping from Tuning the Interaction of the Light- and Heavy-hole Valence Bands, Phys. Rev. B, 82, 115209-1-115209-8, Sep. 16, 2010.

\* cited by examiner

| | $K_xPb_{1-x}Te$ | | | | $K_xPb_{1-x}Se$ | | | $K_{0.02}Pb_{0.98}Te_{1-y}Se_y$ | | | | |
|---|---|---|---|---|---|---|---|---|---|---|---|---|
| x/y | 0.01 | 0.0125 | 0.015 | 0.02 | 0.01 | 0.0125 | 0.015 | 0.15 | 0.25 | 0.75 | 0.85 | 0.95 |
| D (gcm$^{-3}$) | 8.06 | 8.02 | 8.02 | 8.01 | 7.84 | 7.9 | 7.92 | 7.97 | 7.99 | 7.97 | 7.91 | 8.02 |
| δ | 3.11 | 2.95 | 3 | 2.94 | 3.17 | 2.8 | 2.99 | 2.34 | 2.4 | 2.58 | 2.9 | 2.87 |

Table 1. Volumetric density $D$, and power law exponents, $\delta$, of electrical conductivity for $K_xPb_{1-x}Te$, $K_xPb_{1-x}Se$, and $K_{0.02}Pb_{0.98}Te_{1-y}Se_y$.

FIG. 7

|  | K | Na | Pb | Te | Se |
|---|---|---|---|---|---|
| Ionic radius (Å) | 1.33 | 0.97 | 1.20 | 2.11 | 1.91 |
| Pauling's electronegativity | 0.82 | 0.93 | 2.33 | 2.10 | 2.55 |

Table 2 Ionic radius and Pauling's electronegativity of K, Na, Pb, Te, and Se

FIG. 8

THERMOELECTRIC MATERIALS AND METHODS FOR SYNTHESIS THEREOF

RELATED APPLICATIONS

This application claims the benefit of and priority to U.S. Provisional Application Ser. No. 61/617,344, filed Mar. 29, 2012, the entirety of which is hereby incorporated herein by reference for the teachings therein.

STATEMENT OF GOVERNMENT SUPPORT

This invention was made with Government Support under Contract Number DE-SC0001299 awarded by the Department of Energy. The Government has certain rights in the invention.

FIELD

The embodiments disclosed herein relate to thermoelectric materials with improved figure of merit and methods for producing thermoelectric materials with improved figure of merit.

BACKGROUND

Solid-state thermoelectric converters are recently receiving increasing attention due to their potential to make important contributions to the effort on reducing $CO_2$ and greenhouse gas emission and providing cleaner forms of energy. Such converters utilize thermoelectric materials, that is, materials that show the thermoelectric effect in a strong and/or convenient form. Thermoelectric effects involve direct conversion between thermal and electrical energy by employing electrons and holes as the energy carriers, which can be used, for example, for waste heat recovery, and for thermal management of microelectronics and biological systems. The energy conversion efficiency of thermoelectric devices is governed by the dimensionless thermoelectric figure-of-merit (ZT), where a ZT value of about 1 has been a benchmark for many thermoelectric materials.

SUMMARY

Thermoelectric materials and methods for their synthesis are disclosed. In some aspects, there is provided a thermoelectric material having a general formula $Tl_aPb_{1-a}Te_{1-x}Se_x$-$SiyNa_z$, where a has a value between about 0 and about 0.04, x has a value between about 0 and about 1, y has a value between about 0 and about 0.05, and z has a value between about 0 and about 0.03.

In some aspects, there is provided a thermoelectric material having a general formula $K_xPb1_{-x}Te_{1-y}Se_y$, where x has a value between about 0 and about 0.03 and y has a value between about 0 and about 1.

In some aspects, there is provided a method of synthesis of a thermoelectric material that includes generating a plurality of nanoparticles from a starting material comprising lead, tellurium, selenium and one or more dopants selected from the group consisting of sodium, silicon or thallium in sufficient amounts according to a general formula $Tl_aPb_{1-a}Te_{1-x}Se_xSiyNa_z$, where a has a value between about 0 and about 0.04, x has a value between about 0 and about 1, y has a value between about 0 and about 0.05, and z has a value between about 0 and about 0.03, and consolidating the nanoparticles at elevated pressure and temperature.

In some aspects, there is provided a method of synthesis of a thermoelectric material that includes generating a plurality of nanoparticles from a starting material comprising lead, tellurium, selenium and potassium in sufficient amounts according to a general formula $K_xPb1_{-x}Te_{1-y}Se_y$, where x has a value between about 0 and about 0.03 and y has a value between about 0 and about 1, and consolidating the nanoparticles at elevated pressure and temperature.

BRIEF DESCRIPTION OF THE DRAWINGS

The presently disclosed embodiments will be further explained with reference to the attached drawings, wherein like structures are referred to by like numerals throughout the several views. The drawings shown are not necessarily to scale, with emphasis instead generally being placed upon illustrating the principles of the presently disclosed embodiments.

FIG. 7 is a table showing volumetric density D, and power law exponents, δ, of electrical conductivity for embodiment thermoelectric materials of the present disclosure.

FIG. 8 is a table showing ionic radius and Pauling's electronegativity of K, Na, Pb, Te, and Se.

Figure 1A:
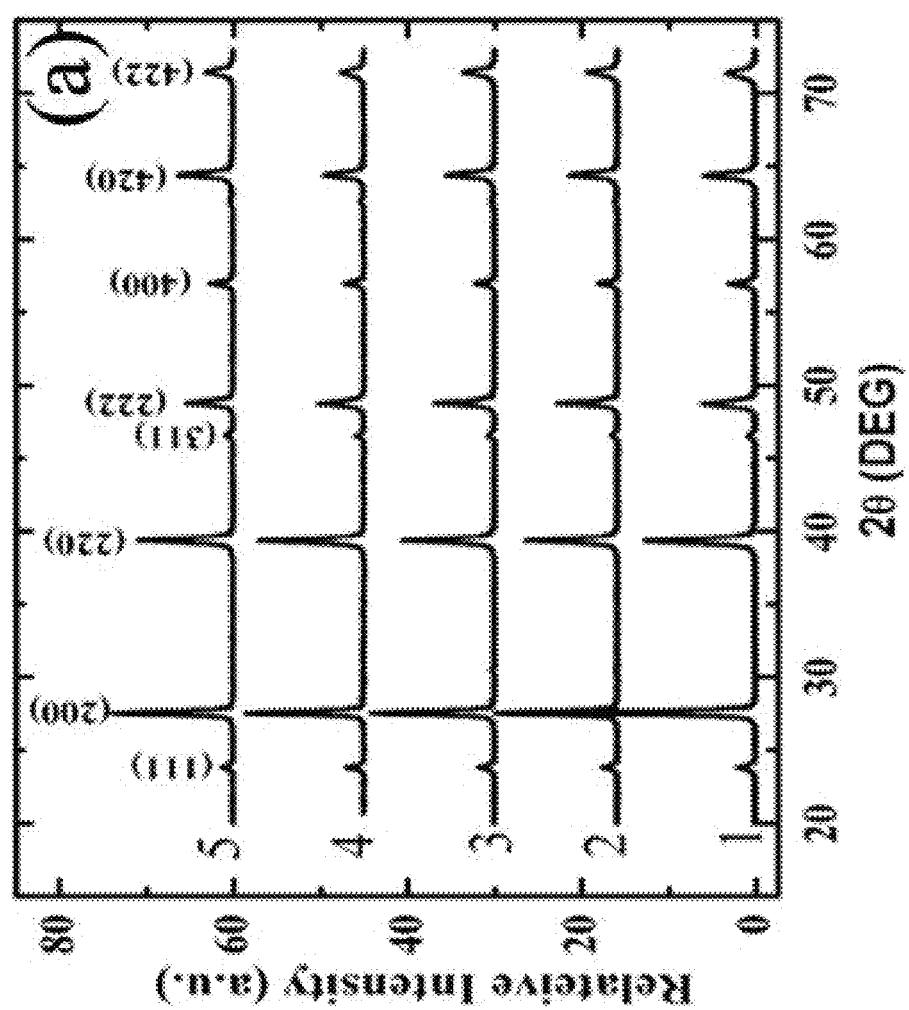
FIG. 1A presents XRD spectra for the following samples: 1) $Tl_{0.02}Pb_{0.98}Te$, 2) $Tl_{0.02}Pb_{0.98}TeSi_{0.02}$, 3) $Tl_{0.02}Pb_{0.98}TeSi_{0.02}Na_{0.015}$, 4) $Tl_{0.02}Pb_{0.98}TeSi_{0.02}Na_{0.02}$, and 5) $Tl_{0.02}Pb_{0.98}TeSi_{0.02}Na_{0.025}$.

While the above-identified drawings set forth presently disclosed embodiments, other embodiments are also contemplated, as noted in the discussion. This disclosure presents illustrative embodiments by way of representation and not limitation. Numerous other modifications and embodiments can be devised by those skilled in the art which fall within the scope and spirit of the principles of the presently disclosed embodiments.

DETAILED DESCRIPTION

Improved thermoelectric (TE) materials and methods for producing such thermoelectric materials are disclosed herein. In particularly, lead telluride/selenide based materials with improved figure of merit and mechanical properties are disclosed herein. In general, lead telluride/selenide based materials of the present disclosure have a stoichiometry according to the following formula: $EPbTe_{1-x}Se_x$, where x has a value between 0 and 1, and E is one or more additional elements added to lead telluride/selenide to alter physical properties of lead telluride/selenides. In some embodiments, E may be a dopant added to replace one of the existing element to create more electrons (n-type) or holes (p-type). In some embodiments, E may be an element added to improve mechanical properties of lead telluride/selenides. In some embodiments, E may be an element added to strengthen lead telluride/selenides. In some embodiments, E may be multiple elements, some elements used as dopants and some elements used to improve mechanical properties of lead telluride/selenides.

The energy conversion efficiency of thermoelectric devices is governed by the dimensionless thermoelectric figure-of-merit (ZT) defined as $ZT=(S^2\sigma/\kappa)T$, where S, σ, κ, and T are the Seebeck coefficient, electrical conductivity, thermal conductivity, and absolute temperature, respectively. Because S, σ, and electronic contribution to κ are coupled via band structures (energy gap $E_g$, effect carrier mass m*, etc.) and scattering mechanisms, it can be difficult to control these parameters independently. Therefore, a ZT value of about 1 has been a benchmark for many thermoelectric materials for a long time. In some embodiments, the thermoelectric materials of the present disclosure have the ZT value greater than 1. In some embodiments, the ZT value of the thermoelectric materials of the present disclosure is greater than 1.1, 1.2, 1.3, 1.4, 1.5, 1.6, or 1.7. While these ZT values can be identified without a limitation in temperature, in some embodiments the thermoelectric materials can exhibit a designated ZT value at a particular temperature or within a temperature range. In some embodiments, ZT is calculated at a temperature above about 500° C., about 600° C., about 700° C. or about 800° C. In some embodiments, the thermoelectric materials of the present disclosure exhibit improved ZT in the temperature range between about 600° C. and about 800° C. It should be noted that the term "between" as used herein to identify a numeric range is intended to include the limits of the numeric range as well as all values in between the limits. That is, a temperature range between about 600° C. and about 800° C. includes the temperature of about 600° C. and the temperature of about 800° C., as well as temperatures in between about 600° C. and about 800° C.

In some embodiments, the lead telluride/selenide based materials of the present disclosure are p-type thermoelectric materials formed by adding sodium (Na), silicon (Si) or both to thallium doped lead telluride/selenide materials. In some embodiments, such materials have a general formula of $Tl_aPb_{1-a}Te_{1-x}Se_xSi_yNa_z$, where a has a value between about 0 and about 0.04, x has a value between about 0 and about 1, y has a value between about 0 and about 0.05; and z has a value between about 0 and about 0.03. In some embodiments, y is about 0 or about 0.02, while z is about 0, 0.015, 0.02 or 0.025. In some embodiment, x is about 0. In some embodiment, a is about 0.02. In some embodiments, such materials have a general formula of $Tl_{0.02}Pb_{0.98}Te_{1-x}Se_xSi_yNa_z$, where x is between about 0 and about 1, y has a value between about 0 and about 0.05; and z has a value between about 0 and about 0.03. In some embodiments, the lead telluride/selenide based materials of the present disclosure have a ZT of greater than 1.5 at about 750K or about 770K.

In some embodiments, the lead telluride/selenide based materials of the present disclosure are p-type thermoelectric materials formed by adding sodium (Na), silicon (Si) or both to lead telluride/selenide materials. In some embodiments, such materials have a stoichiometric formula of $PbTe_{1-x}Se_x$-$Si_yNa_z$, where x is between about 0 and about 1, y has a value between about 0 and about 0.05; and z has a value between about 0 and about 0.03. In some embodiments, y is about 0 or about 0.02, while z is about 0, 0.015, 0.02 or 0.025. In some embodiment, x is about 0.

As one of the most studied intermediate temperature TE materials system, lead telluride (PbTe) retains the highest ZT in bulk TE materials. However, materials based on PbTe suffer from weak mechanical strength. In $Tl_{0.02}Pb_{0.98}Te$ prepared by ball milling plus hot pressing, the sample softens above 673 K as well. It was discovered that by addition of a smaller amount of Si, and doping of Na, very strong samples of p-type $Tl_{0.02}Pb_{0.98}TeSi_{0.02}Na_{0.02}$ can be obtained through ball milling and hot pressing, with peak ZTs of about 1.7 at 773 K.

Without wishing to be bound by a particular theory, this result is unexpected in the sense that the grains are much smaller with an addition of a very small amount of Si due to: 1) better milling effect by Si acting as very small balls because of its much higher hardness than Pb, Te, and Se, and 2) grain growth inhibition of Si nanoparticles, Si nanoparticles are very small acting as the barriers preventing the grains of $Tl_{0.02}Pb_{0.98}Te$ to become larger. The challenges faced in producing the materials of the present disclosure was how to prevent grain growth. In some embodiments, the grain size is less than 20 nm.

In some embodiments, the lead telluride/selenide based materials of the present disclosure are formed by doping lead telluride/selenides with potassium (K). In some embodiments, potassium doped lead telluride/selenides of the present disclosure have a general formula of $K_xPb_{1-x}Te_{1-y}Se_y$, where x has a value between about 0 and about 0.03 and y has a value between about 0 and about 1. In some embodiments, y is 0, 0.15, 0.25, 0.75, 0.85, 0.95 or 1. In some embodiments, x is 0, 0.005, 0.01, 0.0125, 0.015, 0.02, 0.025. In some embodiments, x is 0.02.

As noted above, although lead telluride has a reasonably high figure of merit, its mechanical properties are weak. Adding an appropriate dopant to lead telluride/selenides may improve the mechanical properties of the material while still preserving its desired thermoelectric properties. Potassium was not considered to be an appropriate dopant for lead telluride because potassium has a limited solution in lead telluride, which limits the carrier concentration to less than $6\times10^{19}$ cm$^{-3}$. In some embodiments, the present disclosure, however, provides potassium doped lead telluride/selenides where the carrier concentrations is increased to about $(8\text{-}15)\times10^{19}$ by K doping with the help of Se through the balance of electronegativity.

In some embodiments, $K_xPb_{1-x}Te_{1-y}Se_y$ is band engineered to have ZTs of about 1.5 or higher at about 770K or 870K. In some embodiments, $K_xPb_{1-x}Te_{1-y}Se_y$ is band engineered to have ZTs of about 1.6 at 773K and about 1.7 at 873 K in Te-rich $K_{0.02}Pb_{0.98}Te_{0.75}Se_{0.25}$ and Se-rich $K_{0.02}Pb_{0.98}Te_{0.15}Se_{0.85}$, respectively. In some embodiments, peak ZT value of about 1.6 is obtained in Te-rich samples $K_{0.02}Pb_{0.98}Te_{0.75}Se_{0.25}$ at 773 K. In some embodiments, peak ZT value of about 1.7 is obtained in Se-rich samples $K_{0.02}Pb_{0.98}Te_{0.15}Se_{0.85}$ at 873 K.

In some embodiments, thermoelectric materials of the present disclosure can be used in applications, including, but not limited to, waste heat recovery and conversion to electricity, for thermal management of microelectronics and biological systems, power generation, microprocessor cooling, and geothermal energy. In some embodiments, the telluride/selenide based materials of the present disclosure are used in application where the hot side temperature is less than 500° C. In some embodiments, the telluride/selenide based materials of the present disclosure are used in application where the hot side temperature is less than 450° C.

In some embodiments, the thermoelectric materials of the present disclosure are prepared by grinding or milling starting materials into nanopowders or nanoparticles followed by consolidation of the nanopowders into bulk materials via a hot pressing method. The methods can be used to form some of the thermoelectric compositions described herein, among others. In general, a plurality of nanoparticles can be formed from one or more starting materials. The starting materials may be provided in the form of pellets, powders, chunks, granules, ingots, or similar. The nanoparticles can be generated from the starting materials, for instance, by breaking up one or more starting material into nanopowders (e.g., grinding using any of dry milling, wet milling, or other suitable techniques). In some embodiments, the initial amounts of starting materials used depend on the desired ratio of these materials in the final product, and this amount can be calculated according to the desired stoichiometry of the final product. In some embodiments, the one or more starting materials can be processed into nanopowders separately. In some embodiments, the starting materials may be alloyed during grinding. In some embodiments, the starting materials can be combined together prior to processing the starting materials into nanopowders, such as by melting the materials together into an ingot.

Grinding can be performed using a mill, such as a ball mill using planetary motion, a figure-eight-like motion, or any other motion. In some embodiments, the staring materials can be hand milled in a glove box. When generating nanopowders, some techniques, such as some grinding techniques, produce substantial heat, which may affect the nanoparticle sizes and properties (e.g., resulting in particle agglomeration). Thus, in some embodiments, cooling of a thermoelectric material can be performed while grinding the material. Such cooling may make a thermoelectric material more brittle, and ease the creation of nanoparticles. Cooling and particle generation can be achieved by wet milling and/or cryomilling (e.g., in the presence of dry-ice or liquid nitrogen surrounding the mill).

By way of non-limiting example, the thermoelectric materials of the present disclosure can be prepared by ball milling. The starting materials may be loaded into a stainless steel jar with stainless steel balls, and then subjected to ball milling. In some embodiments, the starting materials are subjected to ball milling for between about 0.1 hours to about 20 hours. In some embodiments, the starting materials may be milled until nanopowders having a size from about 1 nm to about 50 nm are formed.

Next, the nanopowders as-prepared by grinding can be consolidated. Consolidation of the particles may be performed under pressure and elevated temperature in a variety of manners, under a variety of conditions. In some embodiments, direct current induced hot press can be used, where the nanopowders can be loaded into a graphite die with an inner diameter, of, for example, about 12.7 to about 25.4 mm and pressed using a dc hot press. The pressures utilized are typically super-atmospheric, which allow for the use of lower temperatures to achieve consolidation of the nanoparticles. In general, the pressures utilized can range from about 10 MPa to about 900 MPa. In some embodiments, the pressure ranges from about 40 MPa to about 300 MPa. In other embodiments, the pressure ranges from about 60 MPa to about 200 MPa. In some embodiments, the pressures utilized can range from about 10 MPa to about 100 MPa. In some embodiments, the pressure ranges from about 40 MPa to about 100 MPa. In some embodiments, the pressure ranges from about 60 MPa to about 100 MPa.

With respect to the elevated temperature, a range of temperatures can be utilized. In general, the temperature typically ranges from about 200° C. to about the melting point of the copper and selenide nanopowders. In some embodiments, the temperature ranges between about 300° C. and about 700° C. In some embodiments, the nanopowders are hot pressed at between about 400° C. and about 700° C. In some embodiments, the nanopowders are hot pressed at between about 400° C. and about 600° C.

In some embodiments, the as-pressed materials may be subjected to thermal annealing to further improve stability and uniformity of the as-pressed samples. In some embodiments, the as-pressed materials are annealed at a temperature lower than the temperature of consolidation. In an embodiment, the as-pressed materials are annealed at between about 500° C. and about 600° C. Moreover, the as-pressed samples can also be cut or polished into certain application-specific geometries.

The methods and materials of the present disclosure are described in the following Examples, which are set forth to aid in the understanding of the disclosure, and should not be construed to limit in any way the scope of the disclosure as defined in the claims which follow thereafter. The following examples are put forth so as to provide those of ordinary skill in the art with a complete disclosure and description of how to make and use the embodiments of the present disclosure, and are not intended to limit the scope of what the inventors regard as their invention nor are they intended to represent that the experiments below are all or the only experiments performed. Efforts have been made to ensure accuracy with respect to numbers used (e.g. amounts, temperature, etc.) but some experimental errors and deviations should be accounted for.

Example 1

Si and Na Addition to Tl-Doped Lead Tellurides

Synthesis of Samples

Si (99.99%, Alfa Aesar) chunk was first loaded into a ball mill jar with stainless steel balls and ball milled in a high energy ball mill SPEX 8000D (SPEX SamplePrep) for 30 hrs into Si nanopowder. Then, the obtained Si nanopowder, element Tl (granules, 99.999%, Alfa Aesar), Pb (granules, 99.99%, Alfa Aesar), Te (chunks, 99.999%, EZMetals Corp.), and $Na_2Te$ (powder, 99.99%, CERAC Inc.) were weighed according to the stoichiometry of $Tl_{0.02}Pb_{0.98}TeSi_xNa_y$ (x=0 or 0.02, while y=0, 0.015, 0.02, and 0.025) and also loaded into ball mill jar with balls for mechanical alloying by SPEX 8000D. The alloyed nanopowders were then compacted into dense bulk disks of 12.7 mm in diameter in a graphite die through direct current (DC) induced hot pressing. An argon gas filled glove box was used in materials handling process to minimize contaminations.

Characterization of Samples

A laser flash system (NETZSCH LFA-457) and a DSC system (NETZSCH DSC 200-F3) were used to measure the thermal diffusivity and the specific heat of the disk samples, respectively. Thermal conductivity was then calculated as the product of the thermal diffusivity, specific heat, and volumetric density that was determined by the Archimedes' method. A four-point probe system (ULVAC ZEM-3) was used to measure the Seebeck coefficient and electrical conductivity of the bar samples with dimensions of about 2×2×12 mm that were cut from the disks. Hall measurements were carried out on a Lakeshore system (Hall Effect System7712A) for thin disk samples of around 0.5 mm in thickness. The structures of the as-pressed samples were characterized by X-ray diffraction (XRD Bruker-AXS, G8 GAADS) using Cu radiation ($K_\alpha$: 1.54 Å), field emission scanning electron microscopy (SEM, JEOL-6340F), and transmission electron microscopy (TEM, JEOL-2010F).

Results

Through ball milling and hot pressing, dense $Tl_{0.02}Pb_{0.98}TeSi_xNa_y$ samples (about 97% relative to theoretical density) with different values of x and y were prepared, and all were crystallized in rock salt structure evidenced by X-Ray diffraction patterns, shown in FIG. 1A. In particular, FIG. 1A presents XRD spectra for the following samples: 1) $Tl_{0.02}Pb_{0.98}Te$, 2) $Tl_{0.02}Pb_{0.98}TeSi_{0.02}$, 3) $Tl_{0.02}Pb_{0.98}TeSi_{0.02}Na_{0.015}$, 4) $Tl_{0.02}Pb_{0.98}TeSi_{0.02}Na_{0.02}$, and 5) $Tl_{0.02}Pb_{0.98}TeSi_{0.02}Na_{0.025}$.

Figure 1B:
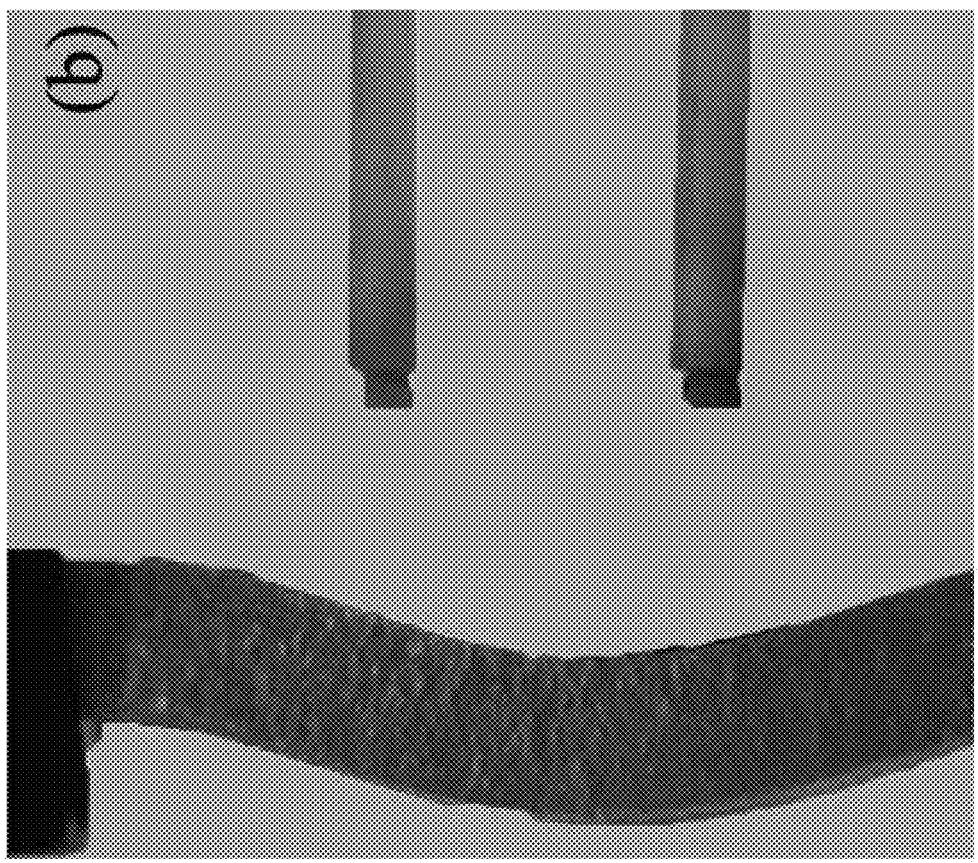
FIG. 1B shows a softened sample $Tl_{0.02}Pb_{0.98}Te$ after measurements up to 673 K.
Figure 1C:
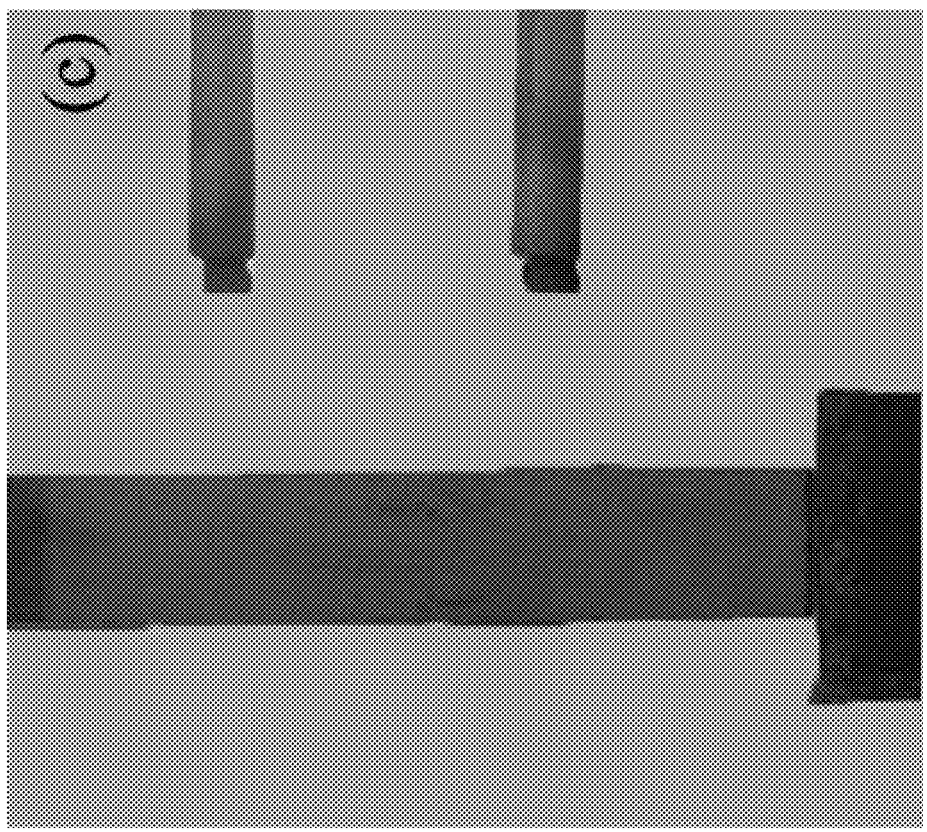
FIG. 1C shows a sample of $Tl_{0.02}Pb_{0.98}TeSi_{0.02}Na_{0.02}$ after measurements at up to 775 K.

FIG. 1B shows a softened sample $Tl_{0.02}Pb_{0.98}Te$ after measurements at up to 673 K. After heating the samples to 673 K for measurements of Seebeck coefficient and resistivity in ZEM-3, the bar samples without Si bent like a bow, as shown in FIG. 1B, which shows the weak mechanical strength at that temperature. FIG. 1C shows the sample of $Tl_{0.02}Pb_{0.98}TeSi_{0.02}Na_{0.02}$ even measurements at up to 775 K. With sufficient Si addition, however, the sample is strong enough to experience high temperature measuring, as shown in FIG. 1C.

Moreover, Na was added to further dope the Si added $Tl_{0.02}Pb_{0.98}Te$ samples, which returned the electrical conductivity of the material to a desired level, as the electrical conductivity of the material decreased following the addition of Si.

Figure 2B:
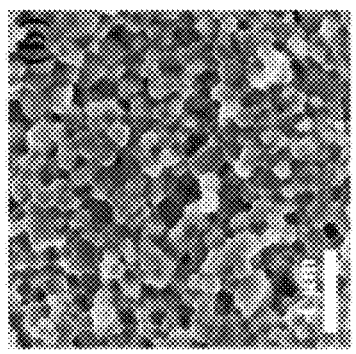
FIG. 2B is a SEM image of a sample of $Tl_{0.02}Pb_{0.98}TeSi_{0.02}$.
Figure 2D:
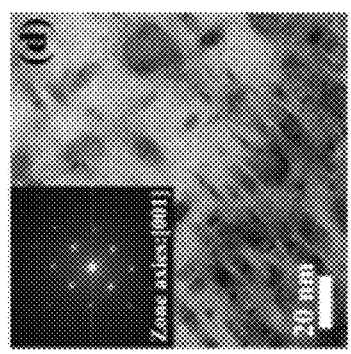
FIG. 2D is a TEM image of a sample of $Tl_{0.02}Pb_{0.98}Te$ showing the very high density of Pb depleted discs, with the inset showing FFT of this image.
Figure 2F:
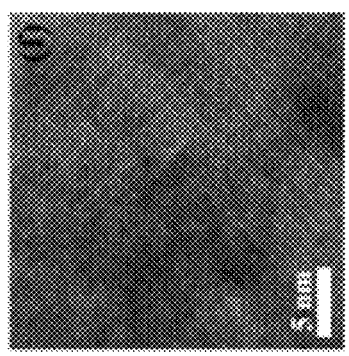
FIG. 2F is a HRTEM of a sample of $Tl_{0.02}Pb_{0.98}TeSi_{0.02}Na_{0.02}$.
Figure 2A:
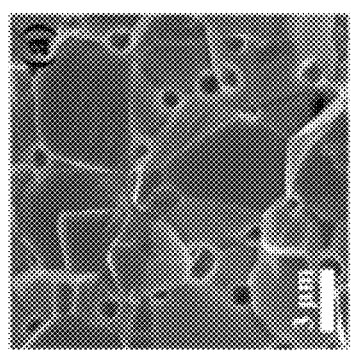
FIG. 2A is a SEM image of a sample of $Tl_{0.02}Pb_{0.98}Te$.
Figure 2C:
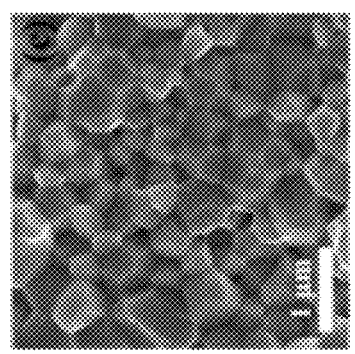
FIG. 2C is a SEM image of a sample of $Tl_{0.02}Pb_{0.98}TeSi_{0.02}Na_{0.02}$.
Figure 2E:
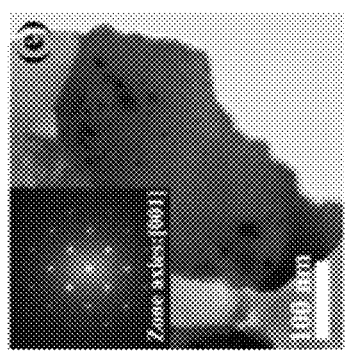
FIG. 2E is a TEM image of a sample of $Tl_{0.02}Pb_{0.98}TeSi_{0.02}Na_{0.02}$ with low density of Pb depleted disk, with the inset showing FFT of this image.

Microscopy study was conducted by SEM, TEM, and HRTEM. The main results are shown in FIGS. 2A-2F. FIG. 2A is a SEM image of sample $Tl_{0.02}Pb_{0.98}Te$. FIG. 2B is a SEM image of sample $Tl_{0.02}Pb_{0.98}TeSi_{0.02}$. FIG. 2C is a SEM image of sample $Tl_{0.02}Pb_{0.98}TeSi_{0.02}Na_{0.02}$. FIG. 2D is a TEM image of sample $Tl_{0.02}Pb_{0.98}Te$ showing the very high density of Pb depleted discs, with the inset showing FFT of this image. FIG. 2E is a TEM image of sample $Tl_{0.02}Pb_{0.98}TeSi_{0.02}Na_{0.02}$ with low density of Pb depleted disk, with the inset showing FFT of this image. FIG. 2F is a HRTEM of sample $Tl_{0.02}Pb_{0.98}TeSi_{0.02}Na_{0.02}$.

Analyzed by linear intercept particle method from the SEM image of $Tl_{0.02}Pb_{0.98}Te$ sample (without Si and Na) shown in FIG. 2A, the average grain size of this sample is about 7 μm, much bigger than the ball milled starting nanopowder with particle size less than 50 nm, clearly indicating significant grain growth happened during hot pressing.

After a 2 atom % Si addition, the grain size dramatically decreased to about 200 nm, shown in FIG. 2B. However, by doping of Na, the grains grow to an average of about 500 nm, as shown in FIG. 2C, which may result in the electrical conductivity similar to that of $Tl_{0.02}Pb_{0.98}Te$.

The defect density is significantly decreased by addition of Si. It has been previously shown that PbTe samples without Si have many Pb depleted discs lying in the <001> planes (the inset of FIG. 2D shows the plane orientation) with a volume density of $9\times10^{17}$ cm$^{-3}$, diameter of 2~5 nm and thickness less than 0.5 nm. It is believed that these defects cause strain and stress near the discs leading to the sample bending at temperature higher than 673 K. Because the densities of both the Si and Na are much lighter than that of the PbTe, it is surprising and unexpected that with Si addition and Na doping, the volume density of the Pb depleted discs is greatly decreased, as shown in FIG. 2E and FIG. 2F, which results in much higher mechanical strength in the sample with Si addition, and enables the samples to endure temperature up to 773 K without bending. Without wishing to be bound by a particular theory, it is believed that the reason that the volume density of the samples increased was due to improved compaction with Si and Na achieved with the methods of fabrication of the present disclosure.

The Hall effect measurements show that the carrier concentration and mobility of $Tl_{0.02}Pb_{0.98}Te$ samples prepared by ball milling and hot pressing are $2.8\times10^{19}$ cm$^{-3}$ and 72.7 cm$^2$V$^{-1}$s$^{-1}$, respectively, which are different from $5.3\times10^{19}$ cm$^{-3}$ and 50 cm$^2$V$^{-1}$s$^{-1}$ in the samples prepared by melting method reported by Heremans (J. P. Heremans, V. Jovovic, E. S. Toberer, A. Saramat, K. Kurosaki, A. Charoenphakdee, S. Yamanaka, G. J. Snyder, Enhancement of Thermoelectric Efficiency in PbTe by Distortion of the Electronic Density of States, Science, 2008, 321(5888), 554-557), primarily due to the different fabricating processes. After a 2 atom % Si addition, these values turn into $1.9\times10^{19}$ cm$^{-3}$ and 44.4 cm$^2$V$^{-1}$s$^{-1}$, resulting in a much lower electrical conductivity and mobility, but by doping of 1.5, 2, and 2.5 atom % Na, the carrier concentration increased to 5.7, 8.9, and $12\times10^{19}$ cm$^{-3}$, respectively, while the mobility stayed as 42, 46 and 45.7 cm$^2$V$^{-1}$s$^{-1}$, respectively.

Figure 3A:
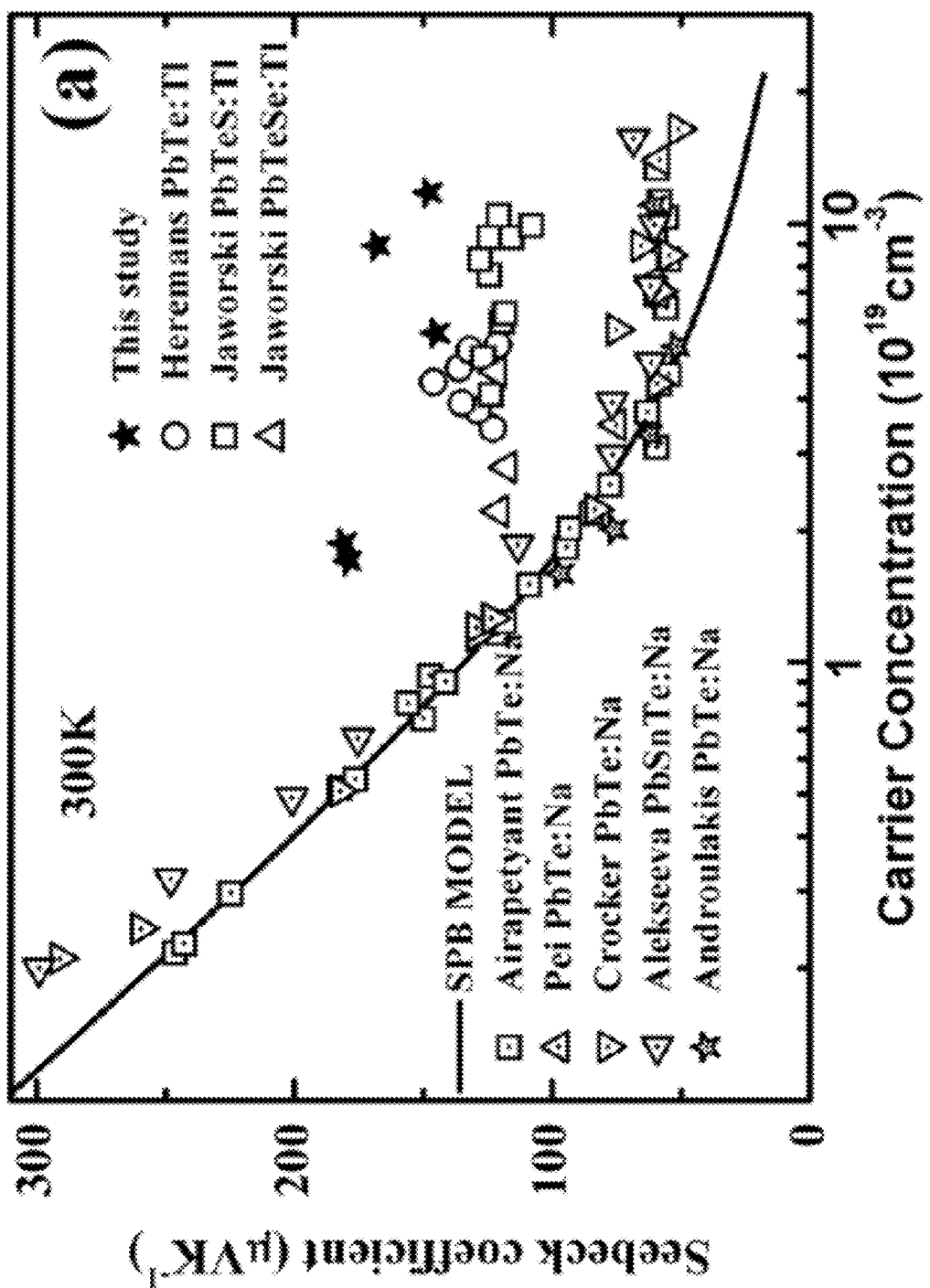
FIG. 3A presents a graph showing dependence of the room temperature Seebeck coefficient on carrier concentration (Pisarenko plot) in embodiment thermoelectric materials of the present disclosure as compared to previously-reported data.

The room temperature (RT) Seebeck coefficient dependence on carrier concentration (Pisarenko plot) of the samples is illustrated in FIG. 3A, compared with Tl and Na doped PbTe samples reported in the following: Heremans, Airapetyant (S. V. Airapetyants, M. N. Vinograd, I. N. Dubrovsk, N. V. Kolomoet, I. M. Rudnik, Structure of Valence Band of Heavily Doped Lead Telluride, Soviet Physics Solid State, USSR, 1966, 8(5), 1069-1072.), Pei (Y. Z. Pei, A. LaLonde, S. Iwanaga, G. J. Snyder, High Thermoelectric Figure of Merit in Heavy Hole Dominated PbTe, Energy & Environmental Science, 2011, 4(6), 2085-2089.), Crocker (A. J. Crocker, L. M. Rogers, Interpretation of Hall Coefficient Electrical Resistivity and Seebeck Coefficient of P-Type Lead Telluride, British Journal of Applied Physics, 1967, 18(5), 563-573), Alekseeva (G. T. Alekseeva, B. G. Zemskov, P. P. Konstantinov, L. V. Prokofeva, K. T. Urazbaeva, Row of Defects in Acceptor Doping of PbTe-Type Semiconductors with Group I Elements, Soviet Physics Semiconductors, USSR, 1992, 26(2), 202-207.), Androulakis (J. Androulakis, I. Todorov, D.-Y. Chung, S. Ballikaya, G. Wang, C. Uher, M. Kanatzidis, Thermoelectric Enhancement in PbTe with K or Na Codoping from Tuning the Interaction of the Light- and Heavy-Hole Valence Bands, Physical Review B, 2010, 82(11), 115209.), Jaworski (C. M. Jaworski, B. Wiendlocha, V. Jovovic, J. P. Heremans, Combining alloy scattering of phonons and resonant electronic levels to reach a high thermoelectric figure of merit in PbTeSe and PbTeS alloys, Energy & Environmental Science, 2011, 4(10), 4155-4162.).

When the carrier concentration is higher than $5\times10^{19}$ cm$^{-3}$, the deviation of the reported Na doped samples from the single parabolic (SPB) model (solid line in FIG. 3A) shows the failure of SPB model in PbTe, where there are actually two nonparabolic valence bands, a "light" one whose band edge lies at about 0.3 eV under the bottom of conduction band, and another "heavy" one whose band edge lies at about 0.2 eV under the "light" one. When the carrier concentration is higher than $5\times10^{19}$ cm$^{-3}$, the Fermi level enters in the second band, and "heavy" carrier contribute to higher thermopower, which leads to the deviation from the SPB model. It appears that the Tl doped PbTe samples, with the help of distortion of density of states (DOS) causing resonant states by Tl, have much higher Seebeck coefficient than that of Na doped PbTe samples without resonant enhancement. The RT Seebeck coefficient of the $Tl_{0.02}Pb_{0.98}TeSi_{0.02}Na_x$ samples, shown in FIG. 3A, confirms the resonant states created by Tl at even higher carrier concentration than that reported by Heremans.

Figure 3B:
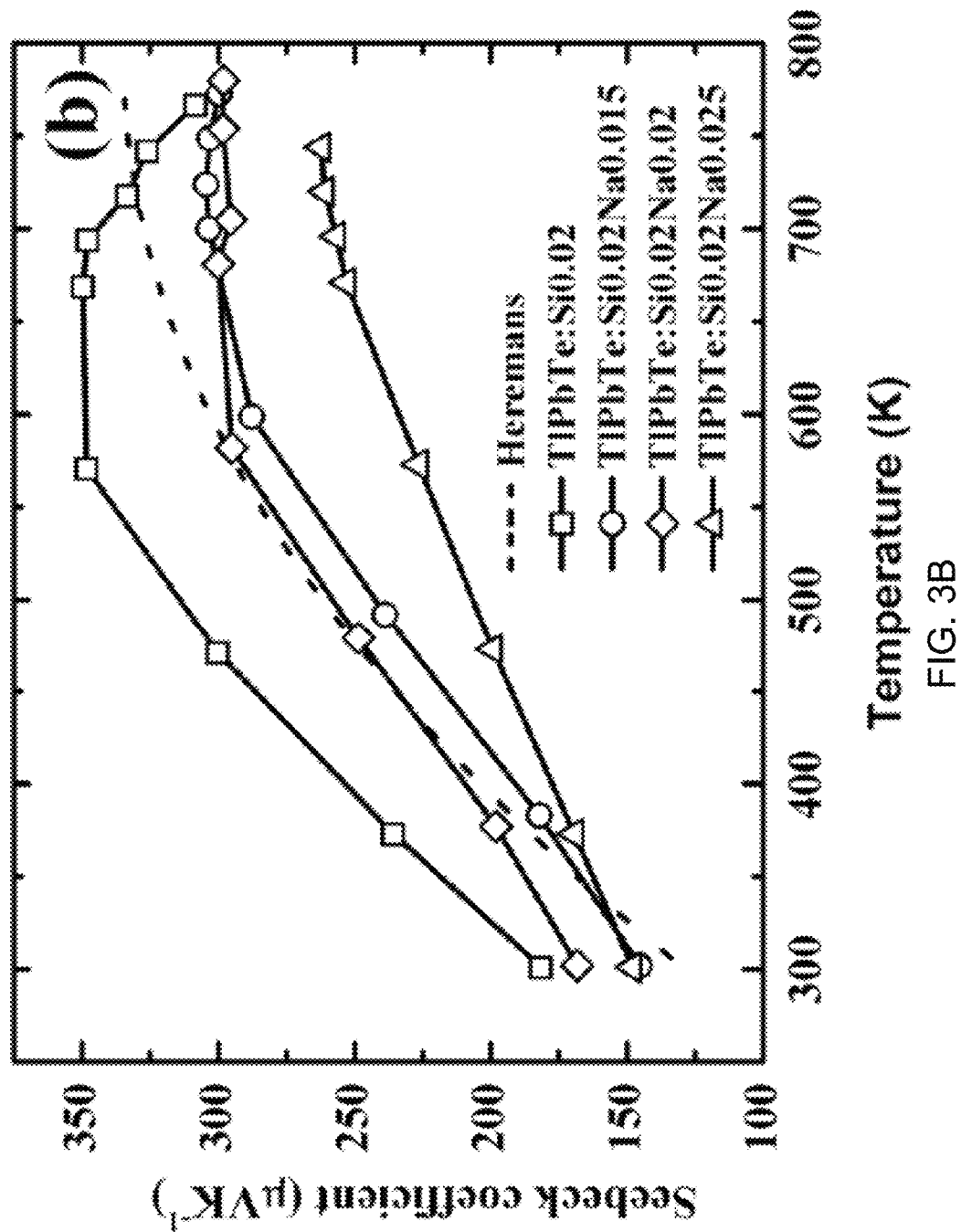
FIG. 3B presents a graph showing temperature dependence of the Seebeck coefficient in embodiment thermoelectric materials of the present disclosure as compared to previously-reported data (dashed line).

The temperature dependence of Seebeck coefficient shown in FIG. 3B demonstrate that the sample without Na doping has the highest Seebeck coefficient and the strongest carrier scattering from grain boundary and Si impurity. In the range of 570-670 K, the Seebeck coefficient of this sample shows independent relationship with temperature, and begins to decrease with temperature at above 670 K, due to the presence of thermally excited minor carriers. In the three samples with Na doping, the sample of moderate Na doping and carrier concentration, 2 atom % and $8.9\times10^{19}$ cm$^{-3}$ respectively, has the highest Seebeck coefficient in the measured temperature, which may originate from the good alignment of Fermi level with the energy of the Tl impurity created resonant states, that would lead to higher Seebeck coefficient enhancement. At temperature higher than 570 K, Seebeck coefficient stays almost the same for samples with 1.5 and 2 atom % Na doping primarily due to the bi-polar effect, leading to lower Seebeck coefficient than the reference data.

Figure 4A:
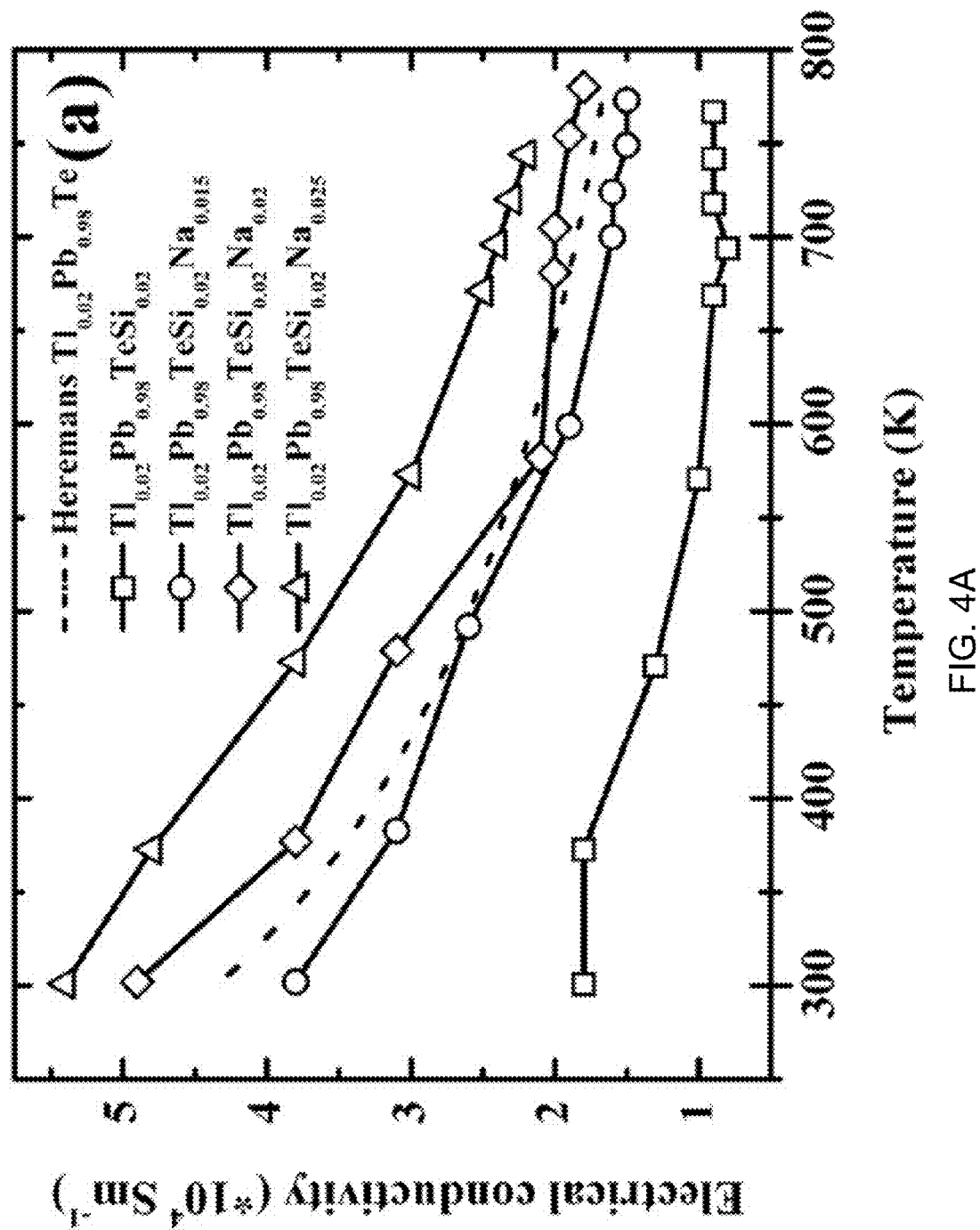
FIG. 4A presents a graph showing temperature dependence of electrical conductivities of embodiment thermoelectric materials of the present disclosure as compared to previously-reported data (dashed line).
Figure 4B:
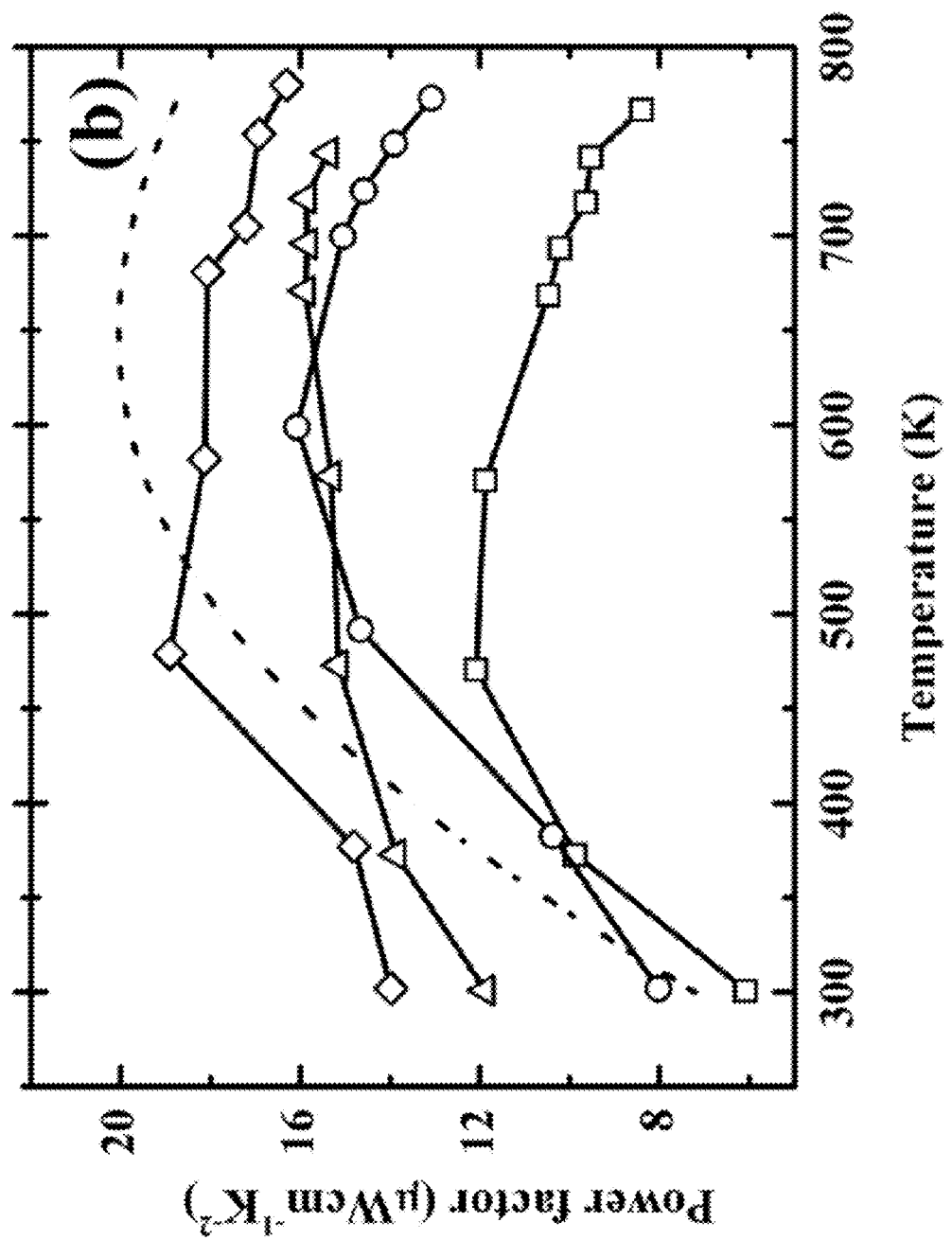
FIG. 4B presents a graph showing temperature dependence of the power factor of embodiment thermoelectric materials of the present disclosure as compared to previously-reported data.

The electrical conductivity and power factor are demonstrated in FIG. 4A and FIG. 4B, respectively, compared with reference data (dashed line) from Heremans. The 2 atom % Si added $Tl_{0.02}Pb_{0.98}Te$ sample has electrical conductivity of 18,000 Sm$^{-1}$ at 300 K and 9,000 Sm$^{-1}$ at 767 K, respectively, about half of the reference data.

To make up the loss of electrical conductivity by Si, Na was doped into $Tl_{0.02}Pb_{0.98}TeSi_{0.02}$ samples. The results indicate that the electrical conductivity of the resulting material was improved, and was even higher than the reference data when enough Na is used. Moreover, higher concentration of Na leads to higher electrical conductivity. The 2 atom % Na doped $Tl_{0.02}Pb_{0.98}TeSi_{0.02}$ sample has electrical conductivity of 18,000 $Sm^{-1}$ at 780 K, a little bit higher than that of reference data. This improvement of electrical conductivity may be due to the increased carrier concentration by Na doping.

The power factors of the measured samples, calculated from $S^2\sigma$, are shown in FIG. 4B. It can be seen that the $Tl_{0.02}Pb_{0.98}TeSi_{0.02}$ sample has the lowest power factor due to the low electrical conductivity, but Na doping increased the power factors significantly. The power factors are higher than the reference data at temperatures lower than 525 K though lower than the reference data at temperatures higher than 525 K. The highest power factor at 773 K, 16.3 $\mu m^{-1}K^{-2}$, of $Tl_{0.02}Pb_{0.98}TeSi_{0.02}Na_{0.02}$ sample is about 13% lower than that of the reference sample.

Figure 5A:
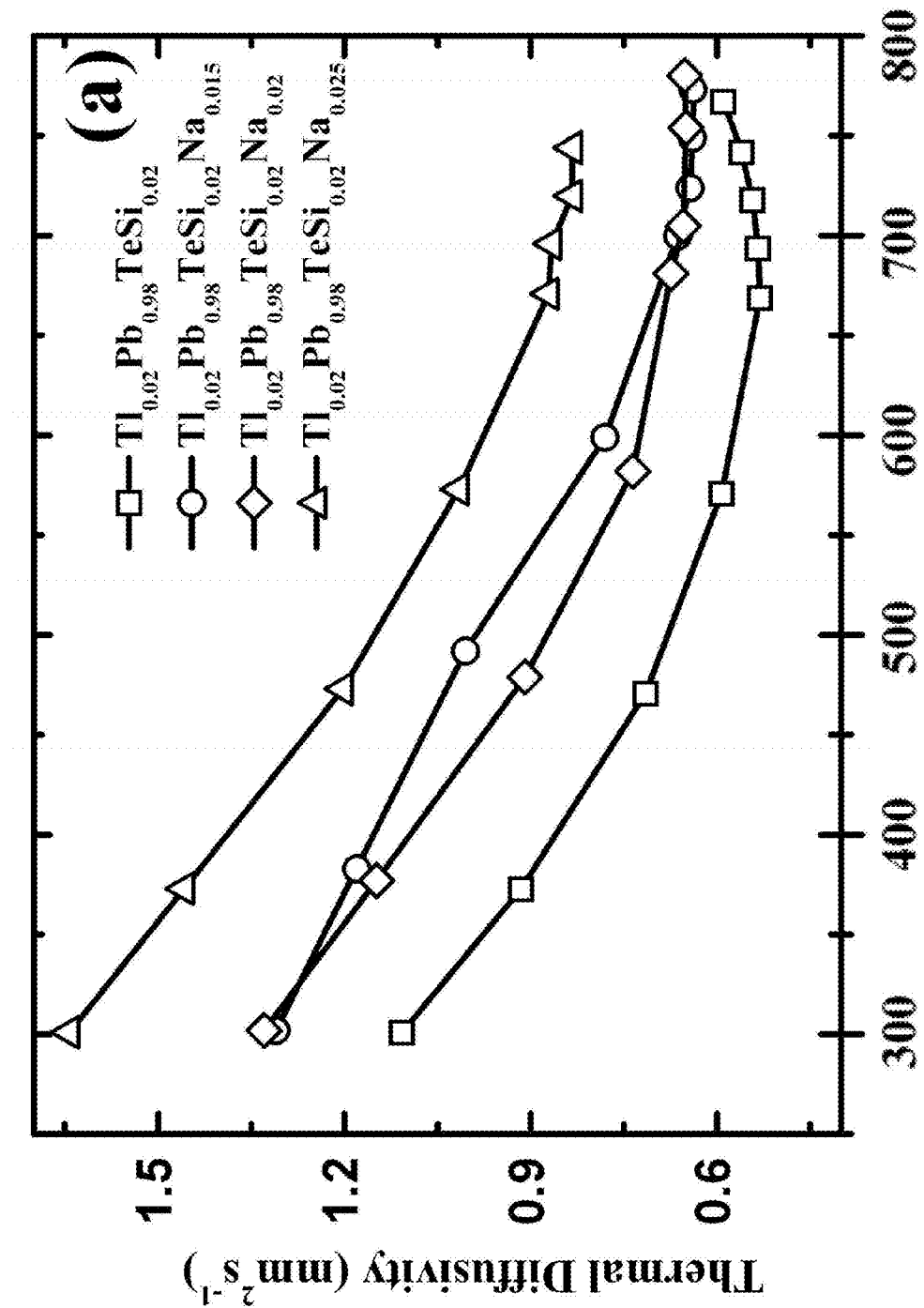
FIG. 5A presents a graph showing temperature dependence of the thermal diffusivity in embodiment thermoelectric materials of the present disclosure.
Figure 5B:
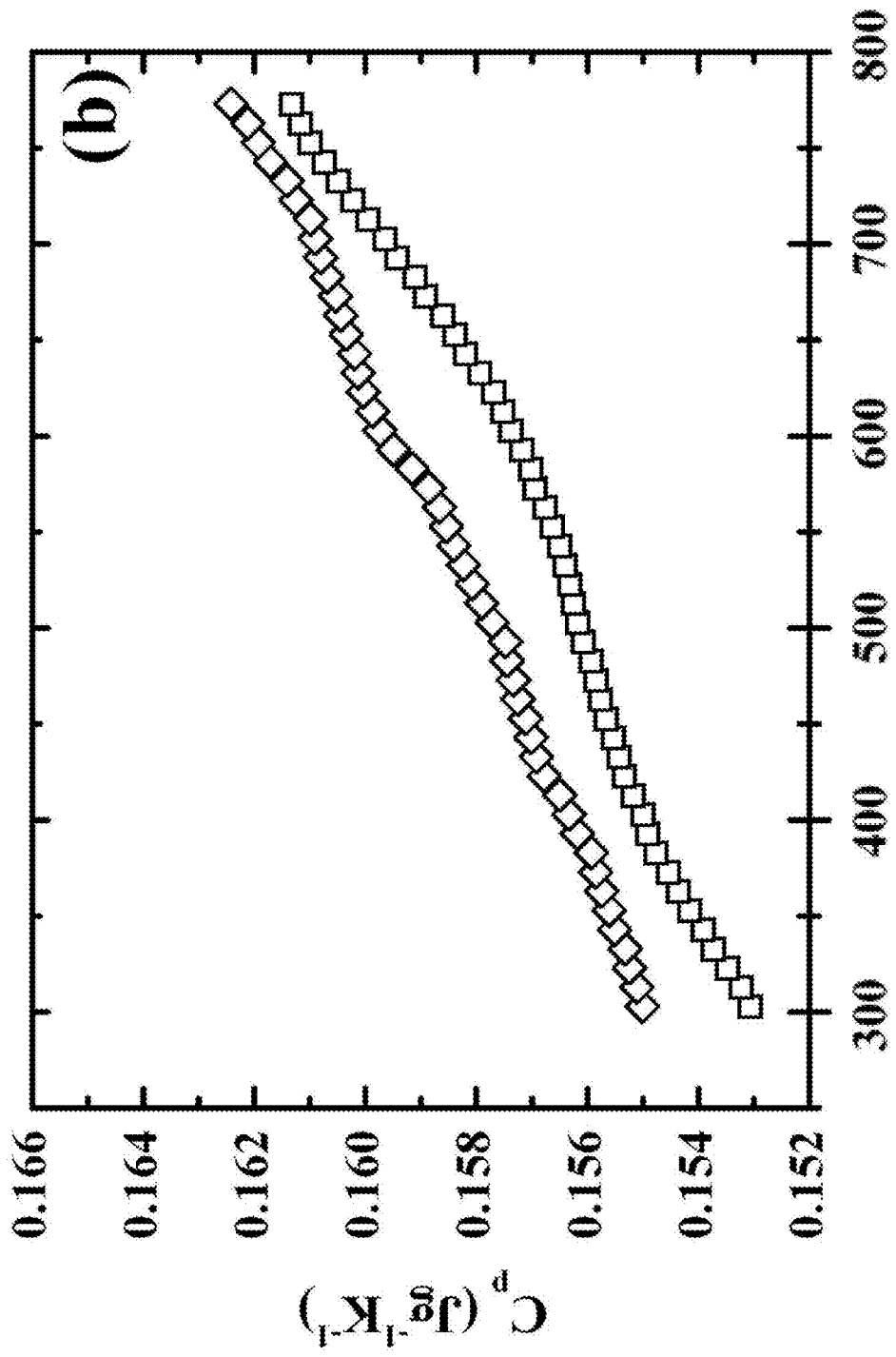
FIG. 5B presents a graph showing temperature dependence of the specific heat in embodiment thermoelectric materials of the present disclosure.
Figure 5C:
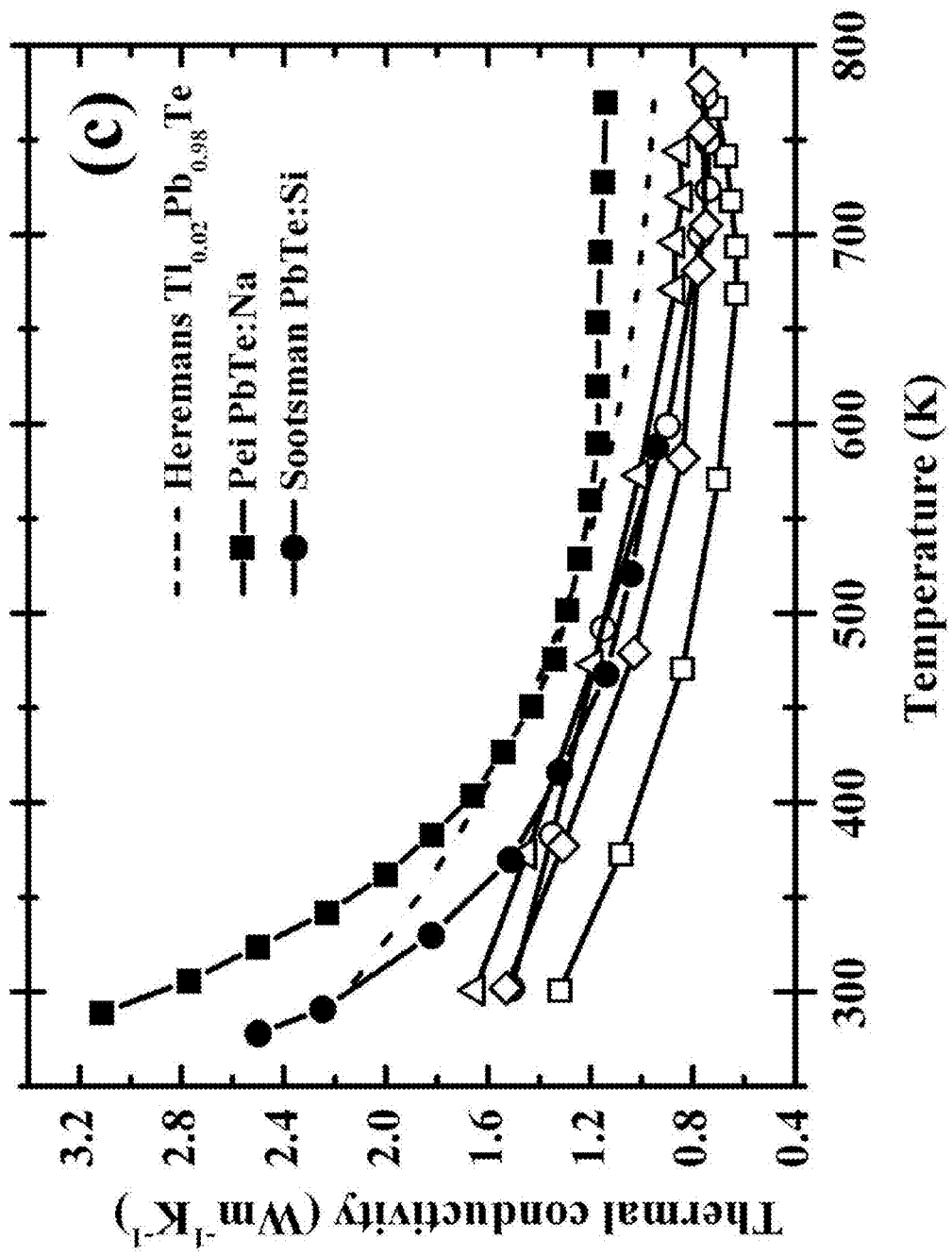
FIG. 5C presents a graph showing temperature dependence of the thermal conductivity in embodiment thermoelectric materials of the present disclosure as compared to previously-reported data (dashed line).
Figure 5D:
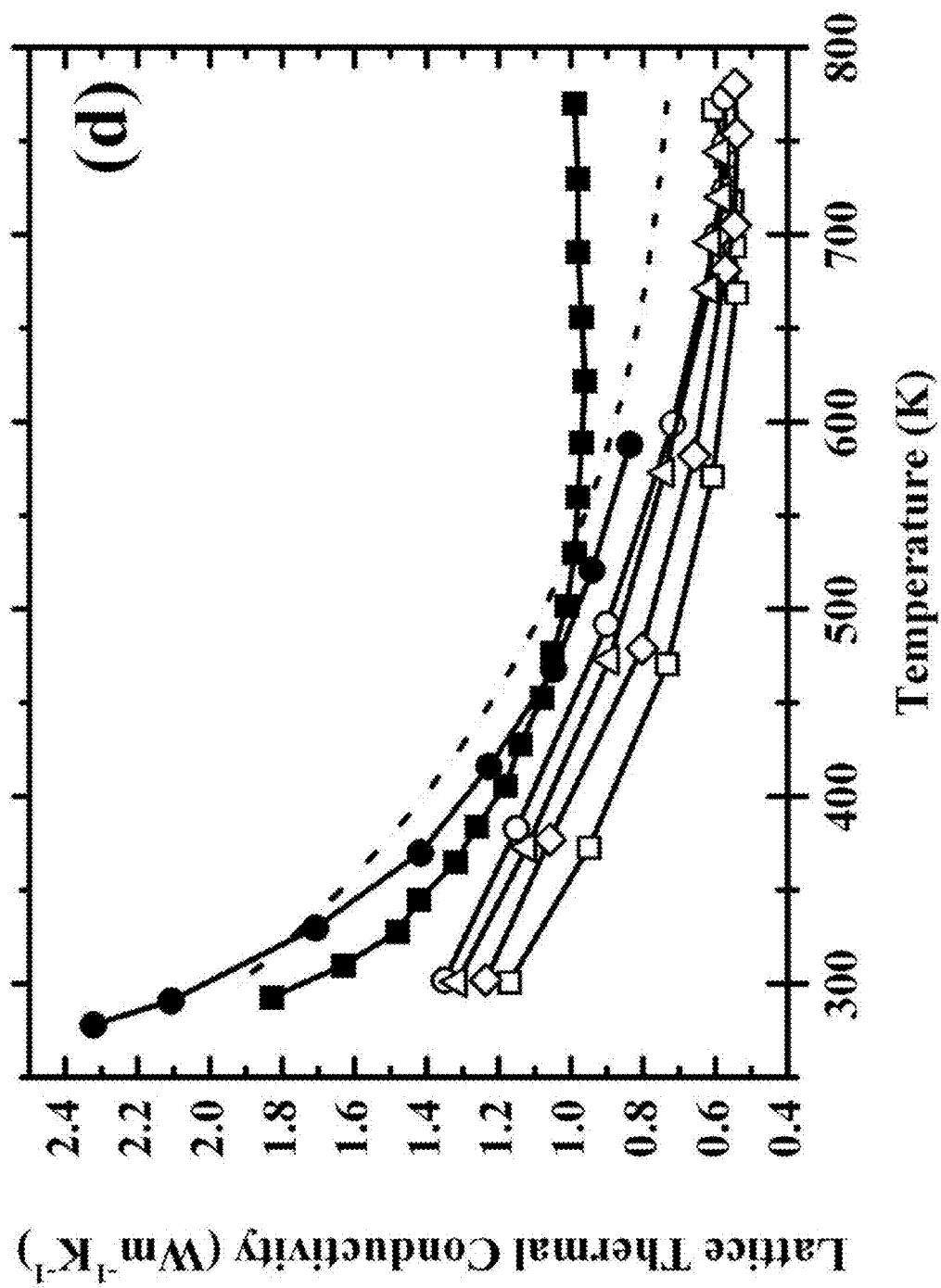
FIG. 5D presents a graph showing temperature dependence of the lattice thermal conductivity in embodiment thermoelectric materials of the present disclosure as compared to previously-reported data (dashed line).

FIG. 5A presents a graph showing temperature dependence of the thermal diffusivity in the thermoelectric materials of the present disclosure. FIG. 5B presents a graph showing temperature dependence of the specific heat in the thermoelectric materials of the present disclosure. FIG. 5C presents a graph showing temperature dependence of the thermal conductivity in the thermoelectric materials of the present disclosure as compared to data previously reported for $Tl_{0.02}Pb_{0.98}Te$ in Heremans, for PbTe:Na in Pei (Y. Z. Pei, A. LaLonde, S. Iwanaga, G. J. Snyder, High Thermoelectric Figure of Merit in Heavy Hole Dominated PbTe, Energy & Environmental Science, 2011, 4(6), 2085-2089) and for PbTe:Si in Sootsman (J. R. Sootsman, J. Q. He, V. P. Dravid, S. Ballikaya, D. Vermeulen, C. Uher, M. G. Kanatzidis, Microstructure and Thermoelectric Properties of Mechanically Robust PbTe—Si Eutectic Composites, Chemistry of Materials, 2010, 22(3), 869-875.) FIG. 5D presents a graph showing temperature dependence of the lattice thermal conductivity in the thermoelectric materials of the present disclosure as compared to data previously reported for $Tl_{0.02}Pb_{0.98}Te$ in Heremans, for PbTe:Na in Pei and for PbTe:Si in Sootsman.

The total thermal conductivity was calculated using $\kappa=\rho DC_p$, where $\rho$ is the volumetric density, D the diffusivity, and $C_p$ the specific heat, respectively. In calculating $\kappa$, the $C_p$ values of 2 atom % Na doped sample were used for all Na doped samples in a conservative way. The total and lattice thermal conductivity of Si added PbTe samples was also plotted as reference, as well as that of samples PbTe:Na and PbTe:Tl. The lattice thermal conductivity is calculated by subtracting the electronic contribution from the total thermal conductivity, $\kappa_L=\kappa-\kappa_e=\kappa-L\sigma T$, where L is the Lorenz number. Because the difficulty of accurate determination of Lorenz number due to the complex band structure and nonparabolicity of the light hole band, an assumption of one parabolic band, predominant acoustic scattering of phonons, and elastic mechanism of carriers scattering was used to estimate L, where the reduced Fermi energy were deduced from the Seebeck coefficient in SPB model. Despite the ignorance of interband interaction between heavy and light holes, which was concluded very important for charge transport in heavily doped PbTe before, and roughness in the estimation, the result of L about $1.52 \times 10^{-8}$ $V^2K^{-2}$ at ~770 K is consistent with the calculation based on multiband model having considered the nonparabolicity of the band. This quite low L compared with the widely used metal values of $2.44 \times 10^{-8}$ $V^2K^{-2}$ reveals the loss of degeneration in high temperatures. Also, the RT Lorenz number $\sim 1.7 \times 10^{-8}$ $V^2K^{-2}$ is about 11% off the results of Kaidanov who ascribed the reducing factor of 1.65 from full degenerate value to the resonant scattering by Tl in PbTe. This method of estimation was used to recalculate the Lorenz number of PbTe:Si sample.

From FIG. 5D, the lattice thermal conductivity of the studied samples is well below the reference data. The $\kappa_L$ of $Tl_{0.02}Pb_{0.98}TeSi_{0.02}Na_{0.02}$ sample at 750 K, 0.54 $Wm^{-1}K^{-1}$, is about 27% lower than that of PbTe:Tl sample, and 45% lower than that of PbTe:Na sample, respectively, which shows big increase of phonon scattering by the grain boundary directly from the fine Si particles from ball milling. The sample without Na doping, having smallest grain size in this study (shown in FIG. 2B), demonstrates the lowest $\kappa_L$, confirming the size effects on lattice thermal conductivity reduction. The $\kappa_L$ of the 2 atom % Si added samples from room temperature (RT) to 580 K, is about 40%~22% lower than the $PbTeSi_{0.08}$ sample fabricated by melting and quenching method, which again suggests an effective way of $\kappa_L$ reduction by ball milling and hot pressing method.

Figure 6:
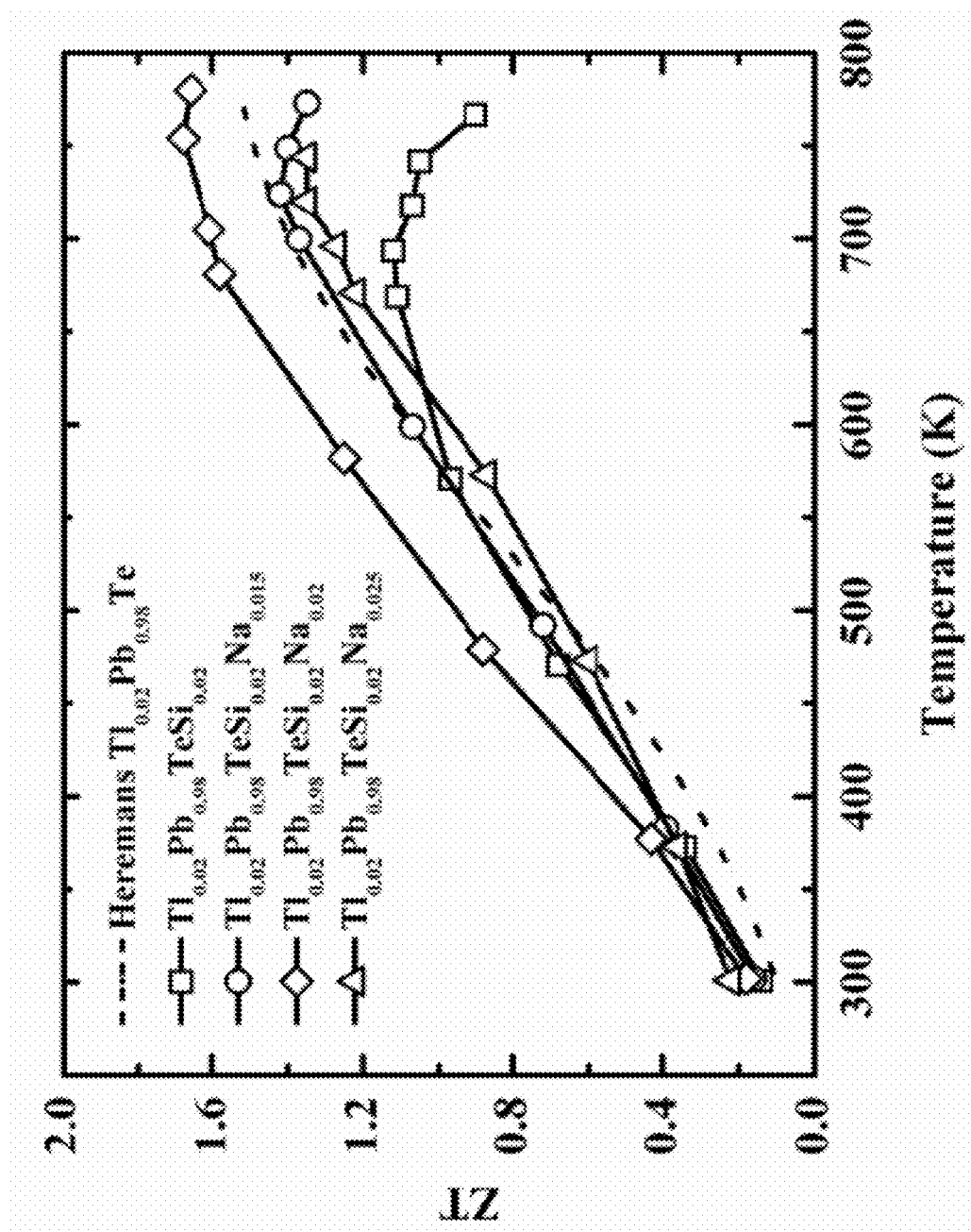
FIG. 6 presents a graph showing temperature dependence of the dimensionless figure-of-merit (ZT) in embodiment thermoelectric materials of the present disclosure.

Due to the quite low lattice thermal conductivity by greatly increased grain boundary scattering of phonons, the Si added Na doped samples have much lower total thermal conductivity, shown in FIG. 5C, leading to ZTs higher than the reference data, as shown in FIG. 6. The highest ZT value in the samples $Tl_{0.02}Pb_{0.98}TeSi_{0.02}Na_{0.02}$ reached about 1.7 at about 770K.

In summary, Si was found to have increased the mechanical strength of samples $Tl_{0.02}Pb_{0.98}TeSi_{0.02}$ made by ball milling and hot pressing due to decreased defect density of Pb-depleted discs and much smaller grains of about 200 nm, but also much lower electrical conductivity for lower ZTs. However, a small amount of Na doping for samples $Tl_{0.02}Pb_{0.98}TeSi_{0.02}Na_{0.02}$ brings back the high electrical conductivity and high power factor, and also produces low thermal conductivity, with the lowest lattice thermal conductivity of about 0.54 $Wm^{-1}K^{-1}$ at 770 K. The highest ZT value reaches about 1.7 at 750 K in mechanically strong samples $Tl_{0.02}Pb_{0.98}TeSi_{0.02}Na_{0.02}$ involving resonant doping, nanograins, and high carrier concentration.

Example 2

Potassium Addition to Lead Telluride/Selenides

Synthesis of Samples

Ingots with nominal compositions $K_xPb_{1-x}Te$ (x=0.01, 0.0125, 0.015, 0.02), $K_xPb_{1-x}Se$ (x=0, 0.005, 0.01, 0.0125, 0.025), and $K_{0.02}Pb_{0.98}Te_{1-y}Se_y$ (y=0.15, 0.25, 0.75, 0.85, 0.95) were prepared in quartz tube with carbon coating. The raw materials inside the quartz tube were slowly raised to 1000-1100° C. and kept for 6 h, then slowly cooled to 650° C. and stayed at that temperature for 50 h, finally slowly cooled to room temperature. The obtained ingots were cleaned and hand milled in a glove box. The sieved (325 mesh) powder was loaded into the half-inch die and hot pressed at 500-600° C. for 2 min. The hot pressed pellets were sealed in quartz tube for further annealing at 600° C. for 4 h to make sure that there was nothing coming out during the measurements at temperatures up to 600° C.

Characterization of Samples

X-ray diffraction spectra analysis was conducted on a PANalytical multipurpose diffractometer with an X'celerator detector (PANalytical X'Pert Pro). The electrical resistivity ($\rho$) was measured by a four-point dc current-switching method together with the Seebeck coefficient based on the static temperature difference method, both of which were conducted on a commercial system (ULVAC ZEM-3). The thermal diffusivity ($\alpha$) and the specific heat ($C_p$) were measured on a laser flash apparatus (Netzsch LFA 447) and a differential scanning calorimetry thermal analyzer (Netzsch DSC200-F3), respectively. The volumetric density (D) was measured by the Archimedes method and shown in FIG. 7. The thermal conductivity κ was calculated using κ=DαC$_p$. The Hall Coefficient R$_H$ at room temperature was measured using the PPMS (Physical Properties Measurement System, Quantum Design). The carrier concentration n and Hall mobility μ$_H$ were calculated using n=1/(eR$_H$) and μ$_H$=σR$_H$, respectively.

Results

As shown in Table 2 in FIG. 8, comparing the ionic radius of Pb, Na, and K, K$^+$ is closer to Pb$^{2+}$ than Na, but is slightly bigger.

Figure 9A:
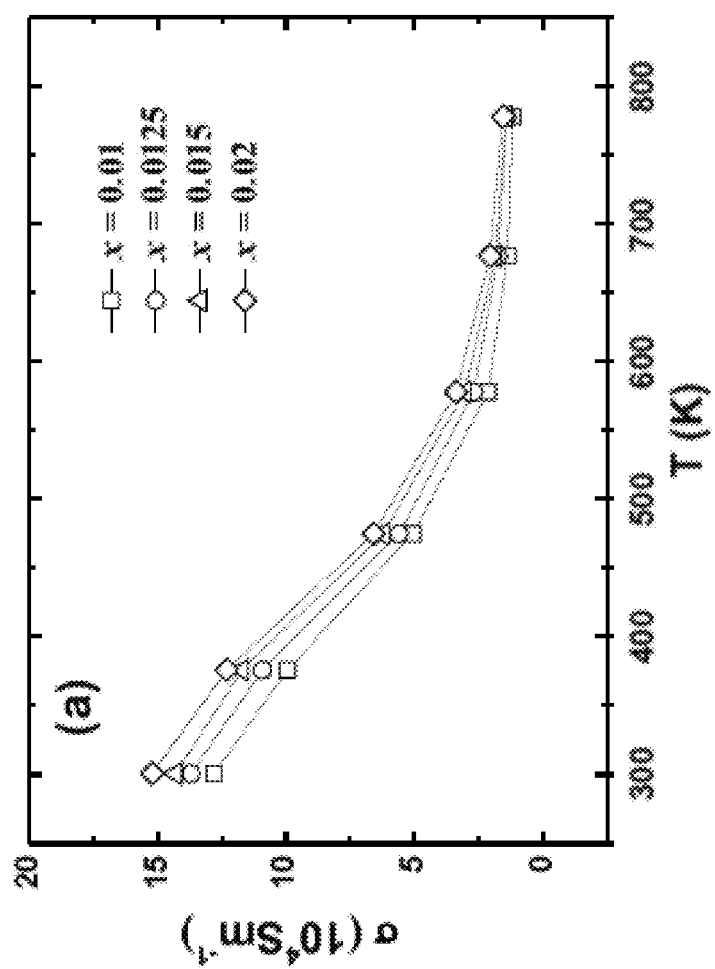
FIG. 9A presents a graph showing temperature dependence of the electrical conductivity for embodiment thermoelectric materials of the present disclosure.
Figure 9B:
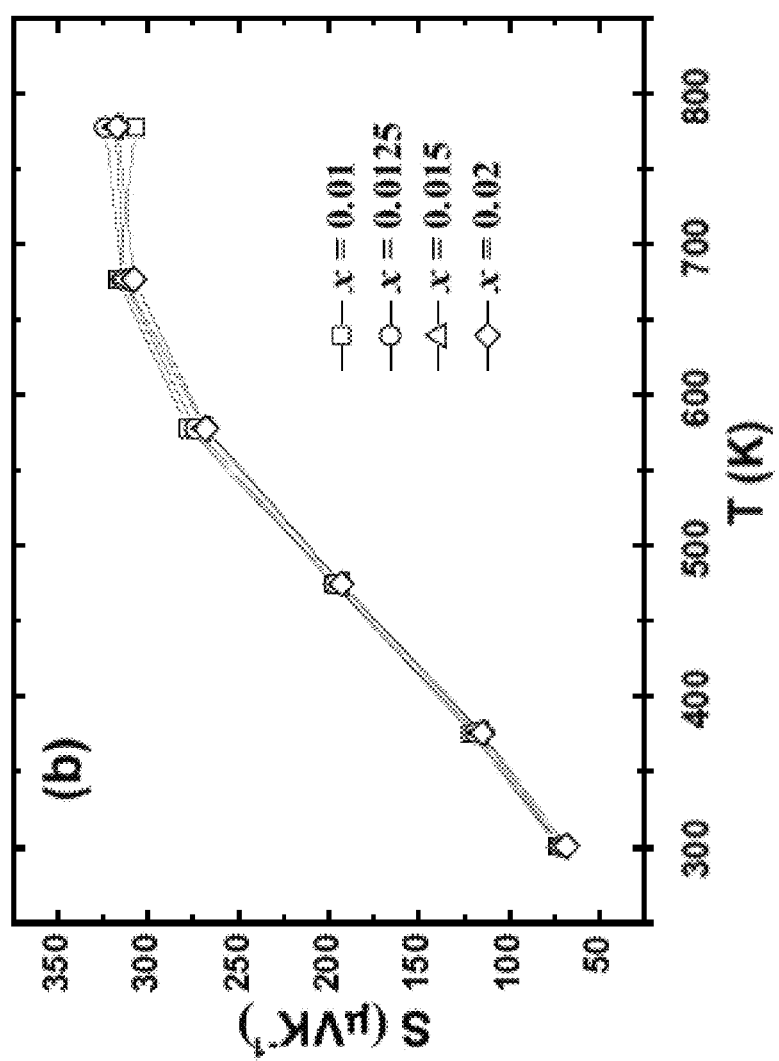
FIG. 9B presents a graph showing temperature dependence of the Seebeck coefficient for embodiment thermoelectric materials of the present disclosure.
Figure 9C:
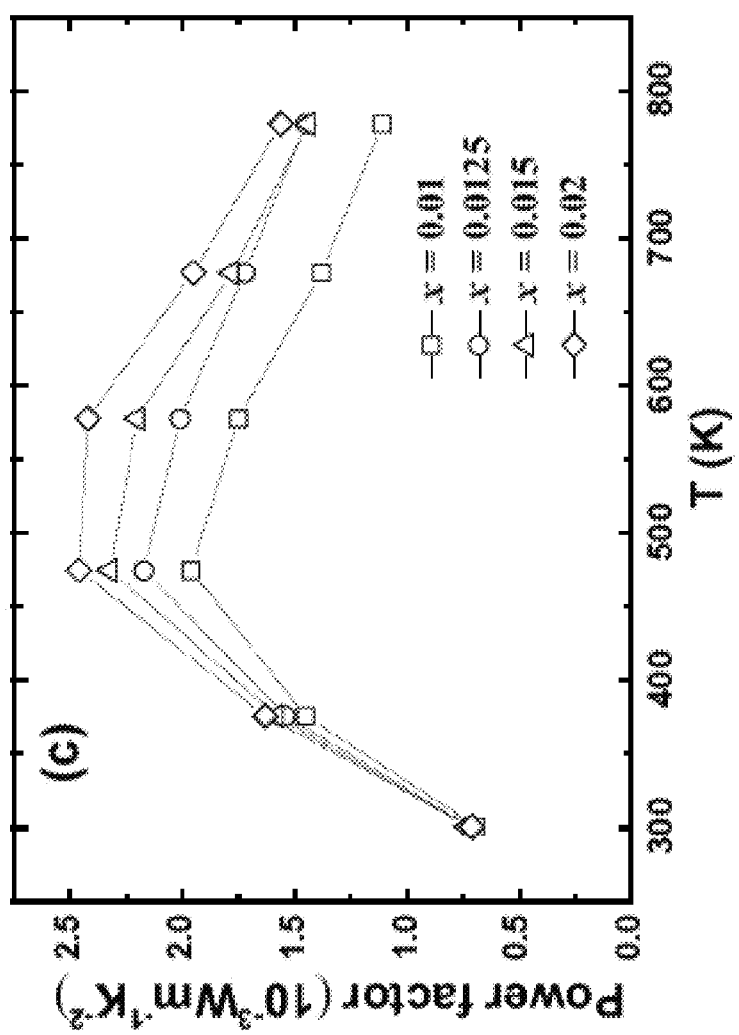
FIG. 9C presents a graph showing temperature dependence of the power factor for embodiment thermoelectric materials of the present disclosure.
Figure 9D:
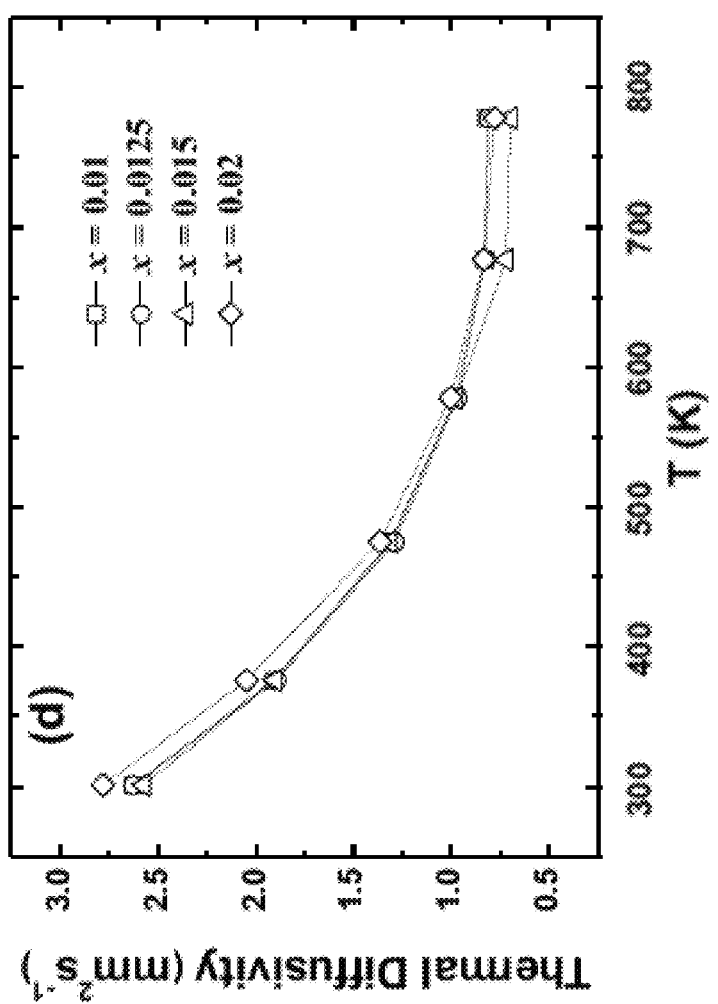
FIG. 9D presents a graph showing temperature dependence of the thermal diffusivity for embodiment thermoelectric materials of the present disclosure.
Figure 9E:
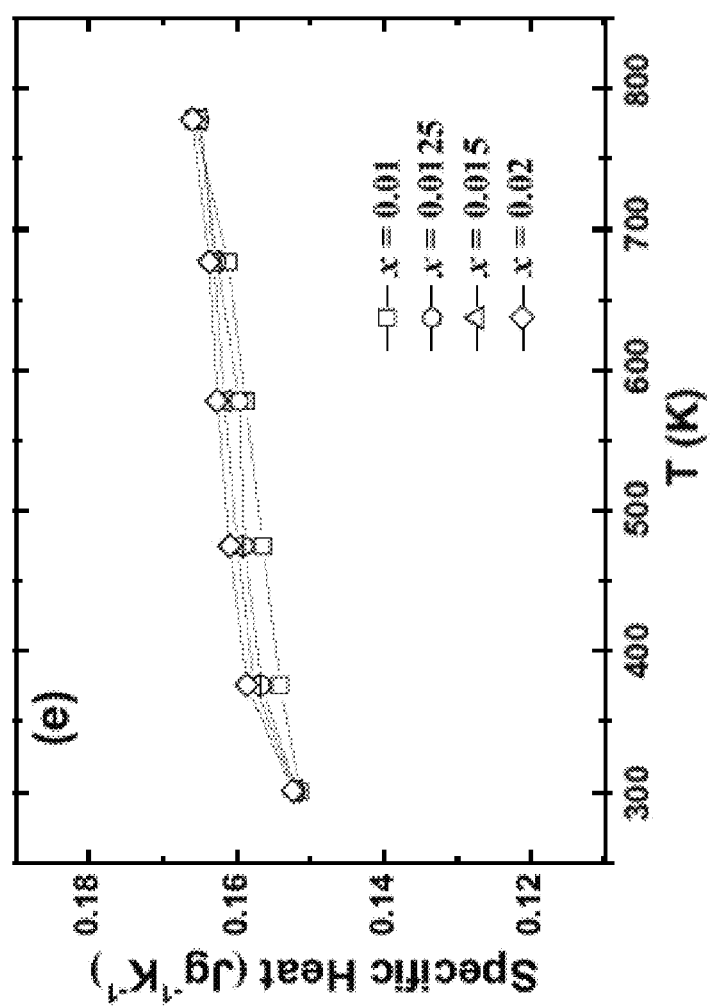
FIG. 9E presents a graph showing temperature dependence of the specific heat for embodiment thermoelectric materials of the present disclosure.
Figure 9F:
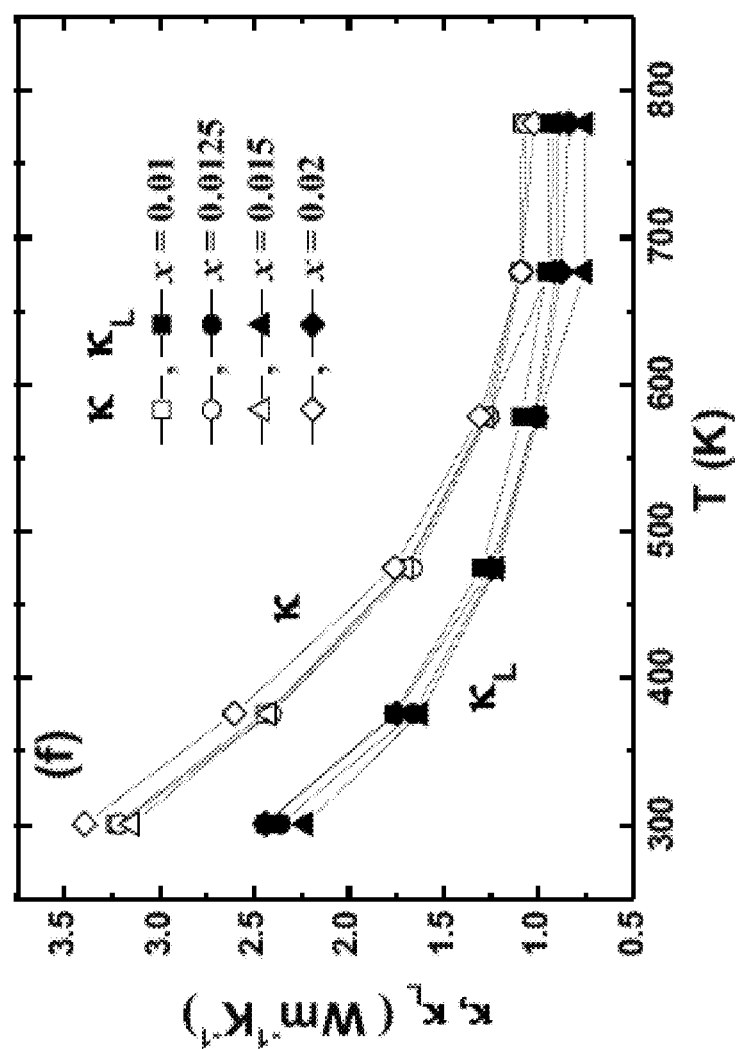
FIG. 9F presents a graph showing temperature dependence of the total thermal conductivity and lattice thermal conductivity for embodiment thermoelectric materials of the present disclosure.

FIGS. 9A-9F show temperature dependence of thermoelectric properties for K$_x$Pb$_{1-x}$Te (x=0.01, 0.0125, 0.015, and 0.02). FIG. 9A presents a graph showing temperature dependence of electrical conductivity for K$_x$Pb$_{1-x}$Te (x=0.01, 0.0125, 0.015, and 0.02). FIG. 9B presents a graph showing temperature dependence of Seebeck coefficient for K$_x$Pb$_{1-x}$Te (x=0.01, 0.0125, 0.015, and 0.02). FIG. 9C presents a graph showing temperature dependence of power factor for K$_x$Pb$_{1-x}$Te (x=0.01, 0.0125, 0.015, and 0.02). FIG. 9D presents a graph showing temperature dependence of thermal diffusivity for K$_x$Pb$_{1-x}$Te (x=0.01, 0.0125, 0.015, and 0.02). FIG. 9E presents a graph showing temperature dependence of specific heat for K$_x$Pb$_{1-x}$Te (x=0.01, 0.0125, 0.015, and 0.02). FIG. 9F presents a graph showing temperature dependence of total thermal conductivity and lattice thermal conductivity for K$_x$Pb$_{1-x}$Te (x=0.01, 0.0125, 0.015, and 0.02). The Seebeck coefficients of all samples shown in FIG. 9B change only slightly. With the increase of K concentration, the electrical conductivity increases, and so does the power factor, as shown in FIG. 9A and FIG. 9C, respectively.

Figure 10:
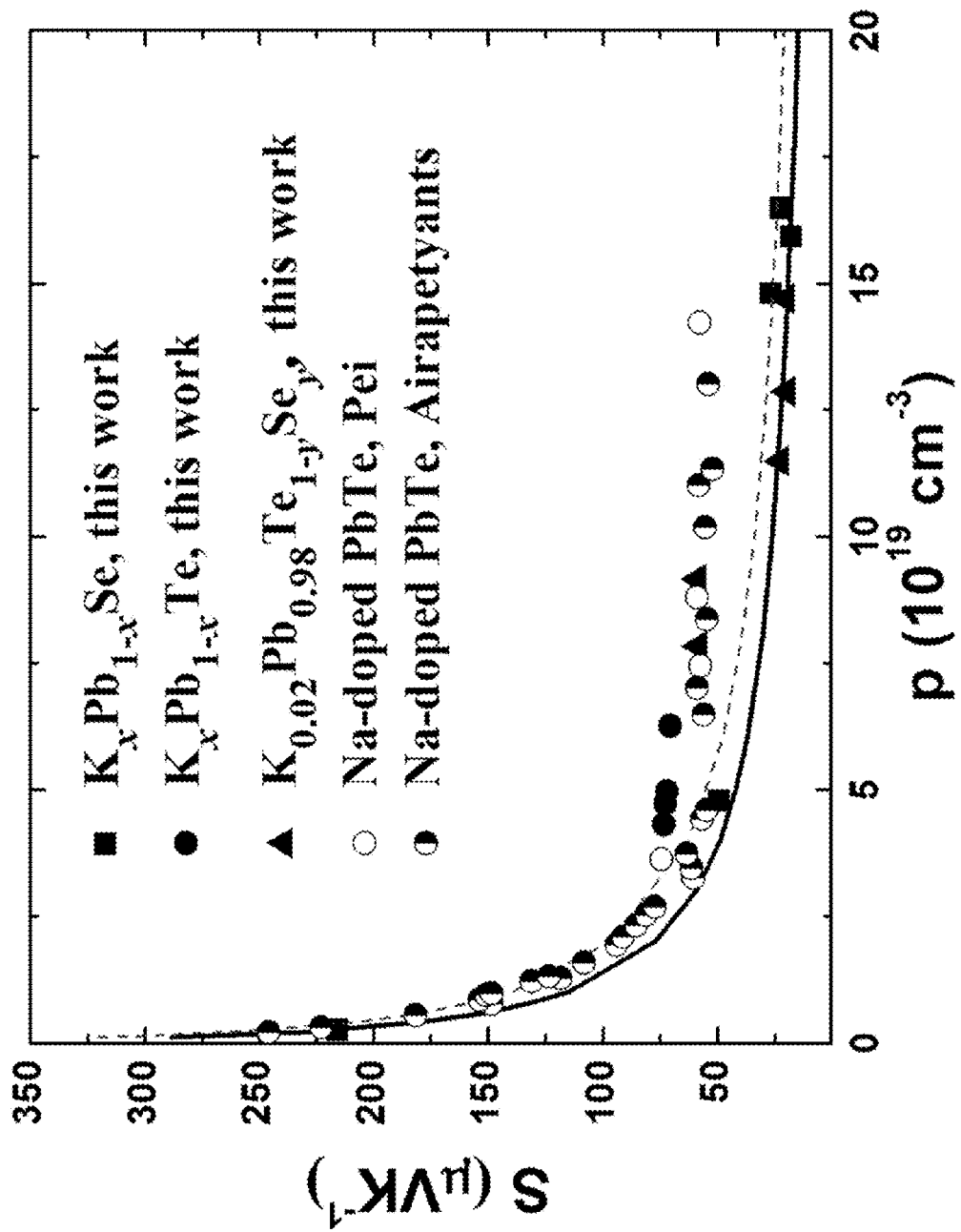
FIG. 10 presents room temperature Pisarenko plots for embodiment thermoelectric materials of the present disclosure as compared to previously-reported data.

FIG. 10 presents room temperature Pisarenko plots for K$_x$Pb$_{1-x}$Te (x=0.01, 0.0125, 0.015, and 0.02, filled circles), K$_x$Pb$_{1-x}$Se (x=0, 0.005, 0.010, 0.0125, and 0.015, filled squares), and K$_{0.02}$Pb$_{0.98}$Te$_{1-y}$Se$_y$ (y=0.15, 0.25, 0.75, 0.85, and 0.95, filled triangles) in comparison with reported data on Na-doped PbTe by Pei et al. (Pei, Y.; LaLonde, A.; Iwanaga, S.; Snyder, G. J. *Energy Environ. Sci.* 2011, 4, 2085) and Airapetyants et al (Airapetyants, S. V.; Vinogradova, M. N.; Dubrovskaya, I. N.; Kolomoets, N. V.; Rudnik, I. M. *Soviet Physics-Solid State* 1966, 8, 1069). Solid curve is based on simple parabolic band model with the effective mass of PbSe m*/m$_e$=0.28. Dashed curve is based on simple parabolic band model with the light holes effective mass of PbTe m*/m$_e$=0.36.

Generally, the room temperature Seebeck coefficient as a function of carrier concentration fall onto the dashed line below the carrier concentration of 3×10$^{19}$ cm$^{-3}$ with only one band contribution, which is the so-called Pisarenko relationship calculated within the framework of a simple parabolic band model from the formula as follows:

$$S = \pm \frac{k_B}{e}\left[\eta_F - \frac{(r+5/2)F_{r+3/2}(\eta_F)}{(r+3/2)F_{r+1/2}(\eta_F)}\right] \quad (1)$$

$$p = \frac{4}{\sqrt{\pi}}\left(\frac{2\pi m_d^* k_B T}{h^2}\right)^{3/2} F_{1/2}(\eta_F) \quad (2)$$

where S is the Seebeck coefficient, k$_B$ the Boltzmann constant, e the electron charge, h the Planck constant, T the temperature, p the carrier concentration of the holes, m$_d$* the effective mass, taken as the light holes effective mass of PbTe m*/m$_e$=0.36, F$_i$(η$_F$) the Fermi-Dirac integrals, η$_F$ the reduced Fermi level and r the scattering factor, which is −½ for the acoustic phonon scattering. The Seebeck coefficient reaches constant (~56 μVK$^{-1}$) when heavily doped, higher than the line, which indicates contributions from a two bands model, contribution to S from both L band and Σ band, $$S_{total}=(\sigma_L S_L+\sigma_\Sigma S_\Sigma)/(\sigma_L+\sigma_\Sigma) \quad (3)$$

where S$_L$ and S$_\Sigma$ are from L and Σ band, respectively, σ$_L$ and σ$_\Sigma$ the electrical conductivity from L and E band, respectively.

It can be seen that the data for the materials of the present disclosure (filled circles) in FIG. 10 flatten at S ~75 μVK$^{-1}$, indicating contribution from two bands by K doping. Also when temperature increases, the Seebeck coefficient increases dramatically to ~320 μVK$^{-1}$ at 775 K, even much higher than that in Na doped PbTe ~260 μVK$^{-1}$ at 775 K. The limited carrier concentration <6×10$^{19}$ cm$^{-3}$ by K doping can also be seen in FIG. 10 for the materials of the present disclosure. It restrains the increase of the electrical conductivity (shown in FIG. 9A), which is the determining factor for S flattening. Furthermore, the decrease of electrical conductivity with temperature is faster in K doped samples, exhibited by the power law exponents, δ, of the electrical conductivity (σ≈T$^δ$) presented in Table 1 in FIG. 7.

The total thermal conductivity κ is the sum of the charge carrier thermal conductivity κ$_e$ and the lattice thermal conductivity κ$_L$, where κ$_e$ can be calculated via the Wiedemann-Franz relation, κ$_e$=LσT, with the Lorenz number L the same for the electrons and holes, κ$_L$ is then derived by subtracting κ$_e$ from κ and presented in FIG. 9F. The Lorenz number κ$_L$ is calculated by formula (4), $$L = \left(\frac{k_B}{e}\right)^2\left(\frac{3F_0(\eta_F)F_2(\eta_F)-4F_1^2(\eta_F)}{F_0^2(\eta_F)}\right) \quad (4)$$

where the reduced Fermi energy η$_F$ is obtained from the Seebeck value using formula (1). Because of the low electrical conductivity, the carrier thermal conductivity is also low. With almost the same lattice thermal conductivity (the same lattice scattering), lower total thermal conductivity was achieved in the materials of the present disclosure compared with Na-doped PbTe.

Figure 11:
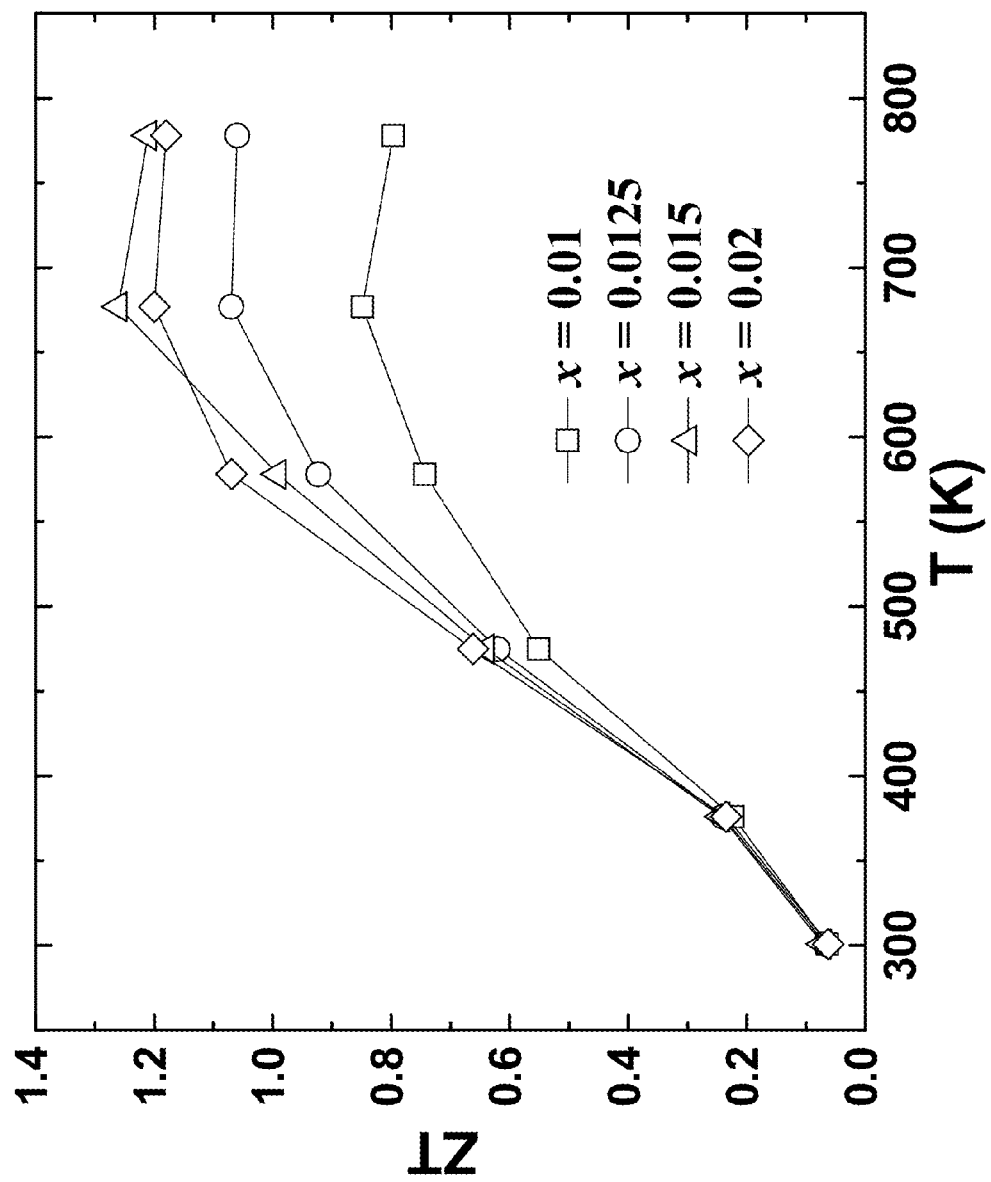
FIG. 11 presents a graph showing temperature dependence of the dimensionless figure-of-merit (ZT) in embodiment thermoelectric materials of the present disclosure.

FIG. 11 presents a graph showing temperature dependence of the dimensionless figure-of-merit (ZT) for K$_x$Pb$_{1-x}$Se (x=0, 0.005, 0.010, 0.0125, and 0.015). As shown in FIG. 11, the highest ZT value achieved was about 1.3 at about 673 K for K$_{0.015}$Pb$_{0.085}$Te, which is comparable with Na doped PbTe at the same temperature.

In both Pb—Te and Pb—Se systems, K$^+$ and Na$^+$ dopants substitute Pb$^{2+}$ and both K and Na substitutions reduce the Pauling's electronegativity (PE) of Pb$^{2+}$, shown in Table 2 of FIG. 8. In spite of the comparable ionic radius, the solubility of K and Na is determined by the difference of electronegativity between the average anions (Te$^{2-}$ or Se$^{2-}$) and cations (Pb$^{2+}$ together with K$^+$ or Na$^+$) after doping. Typically, larger difference results in higher solubility. Since K has a lower electronegativity than Na, the average cation electronegativity after doping is expected to be lower in the case of K substitution. For Pb—Te, lower average cation electronegativity reduces the electronegativity difference between Te$^{2-}$ and Pb$^{2+}$, so K has less solubility than Na in Pb—Te. For Pb—Se, the situation is opposite (lower average cation electronegativity enlarges the electronegativity difference between Se$^{2-}$ and Pb$^{2+}$), thus K has higher solubility than Na in Pb—Se. The heavy band can be activated only when the material is highly doped. The increased solubility of K by balance of electronegativity using Se can enhance the electrical conductivity, and Seebeck coefficient as well with contribution from heavy band, which, can also improve the Zt value. Without this effect, any improvement of the figure of merit in the instant materials is restricted.

Figure 12A:
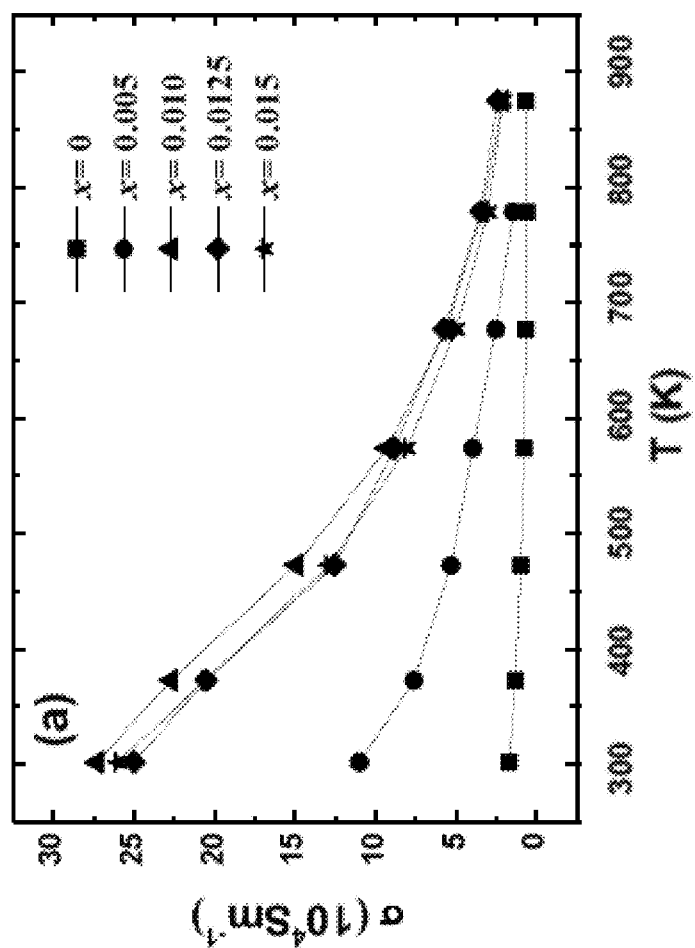
FIG. 12A presents a graph showing temperature dependence of the electrical conductivity for embodiment thermoelectric materials of the present disclosure.
Figure 12B:
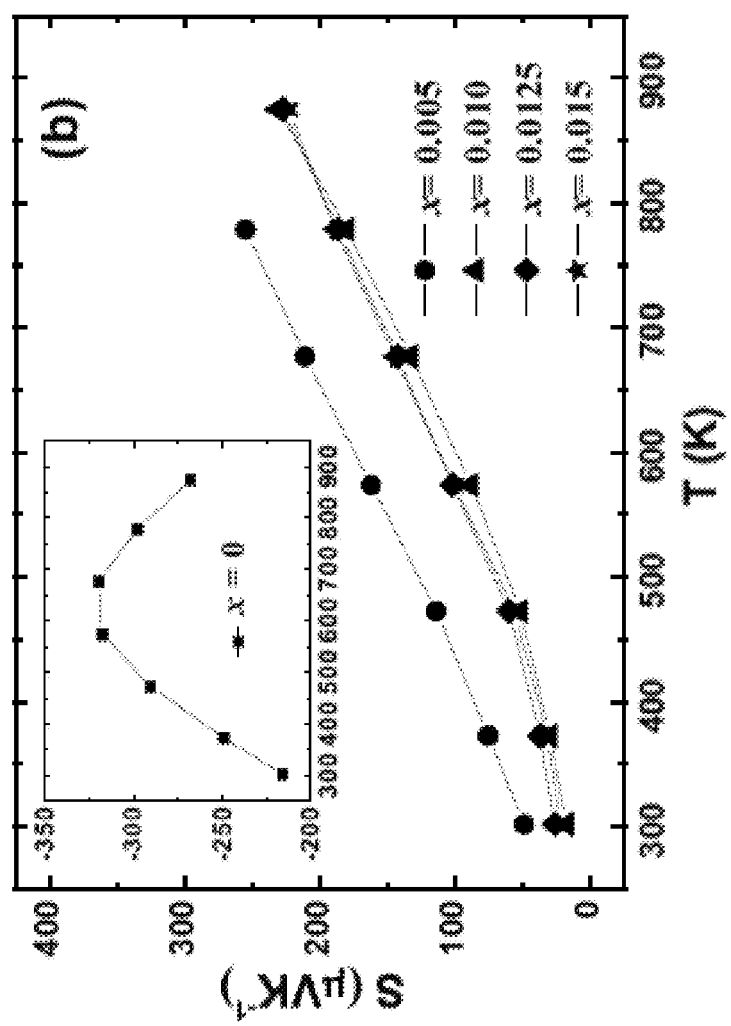
FIG. 12B presents a graph showing temperature dependence of the Seebeck coefficient for embodiment thermoelectric materials of the present disclosure.
Figure 12C:
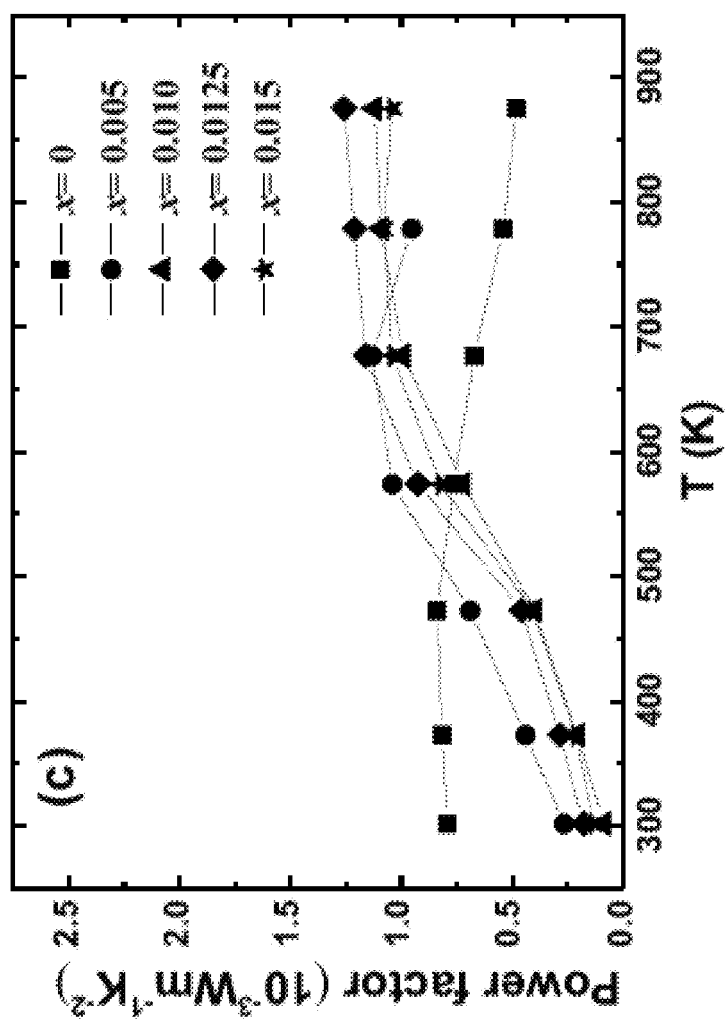
FIG. 12C presents a graph showing temperature dependence of the power factor for embodiment thermoelectric materials of the present disclosure.
Figure 12D:
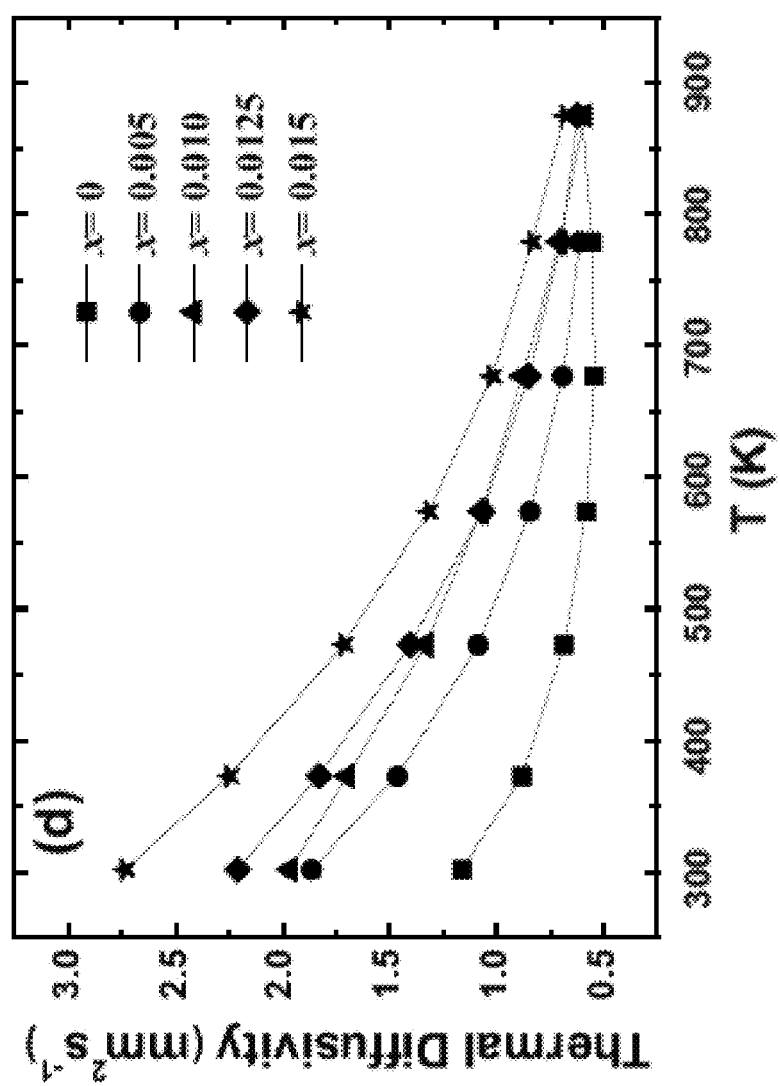
FIG. 12D presents a graph showing temperature dependence of the thermal diffusivity for embodiment thermoelectric materials of the present disclosure.
Figure 12E:
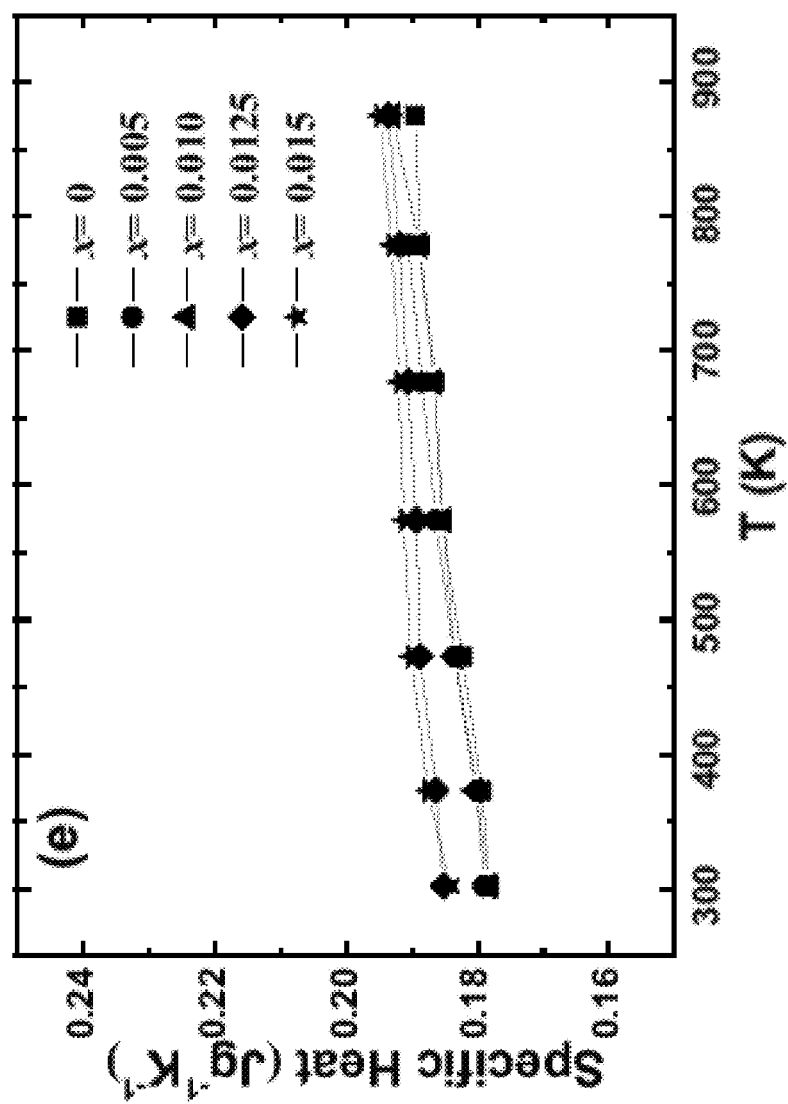
FIG. 12E presents a graph showing temperature dependence of specific heat for embodiment thermoelectric materials of the present disclosure.
Figure 12F:
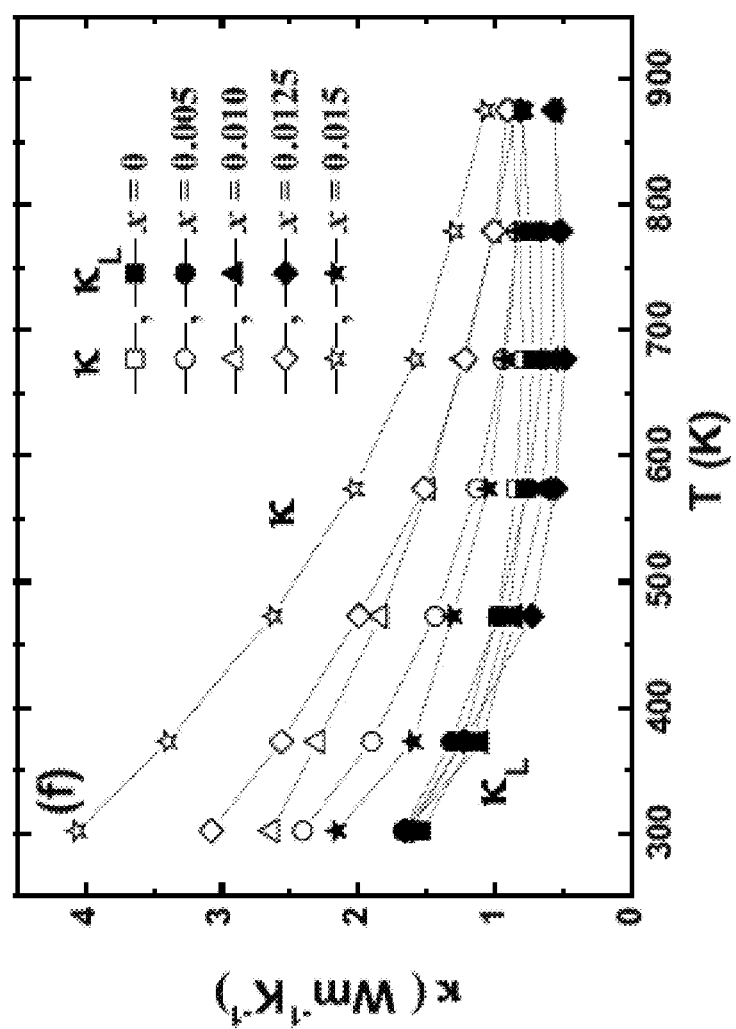
FIG. 12F presents a graph showing temperature dependence of the total thermal conductivity and lattice thermal conductivity for embodiment thermoelectric materials of the present disclosure.

With different K concentrations, samples $K_xPb_{1-x}Se$ (x=0, 0.005, 0.010, 0.0125, and 0.015) were prepared and measured. FIGS. 12A-12F show temperature dependence of thermoelectric properties for $K_xPb_{1-x}Se$ (x=0, 0.005, 0.010, 0.0125, and 0.015). FIG. 12A presents a graph showing temperature dependence of electrical conductivity for $K_xPb_{1-x}Se$ (x=0, 0.005, 0.010, 0.0125, and 0.015). FIG. 12B presents a graph showing temperature dependence of Seebeck coefficient for $K_xPb_{1-x}Se$ (x=0, 0.005, 0.010, 0.0125, and 0.015). FIG. 12C presents a graph showing temperature dependence of power factor for $K_xPb_{1-x}Se$ (x=0, 0.005, 0.010, 0.0125, and 0.015). FIG. 12D presents a graph showing temperature dependence of thermal diffusivity for $K_xPb_{1-x}Se$ (x=0, 0.005, 0.010, 0.0125, and 0.015). FIG. 12E presents a graph showing temperature dependence of specific heat for $K_xPb_{1-x}Se$ (x=0, 0.005, 0.010, 0.0125, and 0.015). FIG. 12F presents a graph showing temperature dependence of total thermal conductivity and lattice thermal conductivity for $K_xPb_{1-x}Se$ (x=0, 0.005, 0.010, 0.0125, and 0.015).

When x≥0.01, the electrical conductivity increases dramatically. The room temperature carrier concentration is increased to ~$1.8 \times 10^{20}$ cm$^{-3}$ (shown in FIG. 10). Based on the simple parabolic band model, a room temperature Pisarenko plot, showing temperature dependence of ZT for $K_xPb_{1-x}Se$ (x=0, 0.005, 0.010, 0.0125, and 0.015), was prepared using the effective mass of $m^*/m_e$=0.28 for PbSe (solid line). All the measured data (filled squares) fall onto the plot in spite of the coexistence of flatten band ~0.35 eV (0 K) below the band edge in PbSe. The pinning of the Fermi level by the heavy band happens only at the high temperature when the offset value of the two bands is small enough. High Seebeck coefficient ~210 µVK$^{-1}$ at 875 K can be obtained with the contribution from both bands. Since band gap of PbSe increases with temperature (~0.43 eV at 850 K vs. ~0.28 eV at 300 K), the Seebeck coefficient goes up all the way with increasing temperature without any sign of bipolar effect. The low lattice thermal conductivity, ~1.7 at 300 K and ~0.6 Wm$^{-1}$K$^{-1}$ at high temperature was calculated here for K-doped PbSe with L got from Equation (4). It was noticed that the electrical conductivity decreases rapidly with increasing temperature, indicating by δ shown in Table 1 in FIG. 7.

Figure 13:
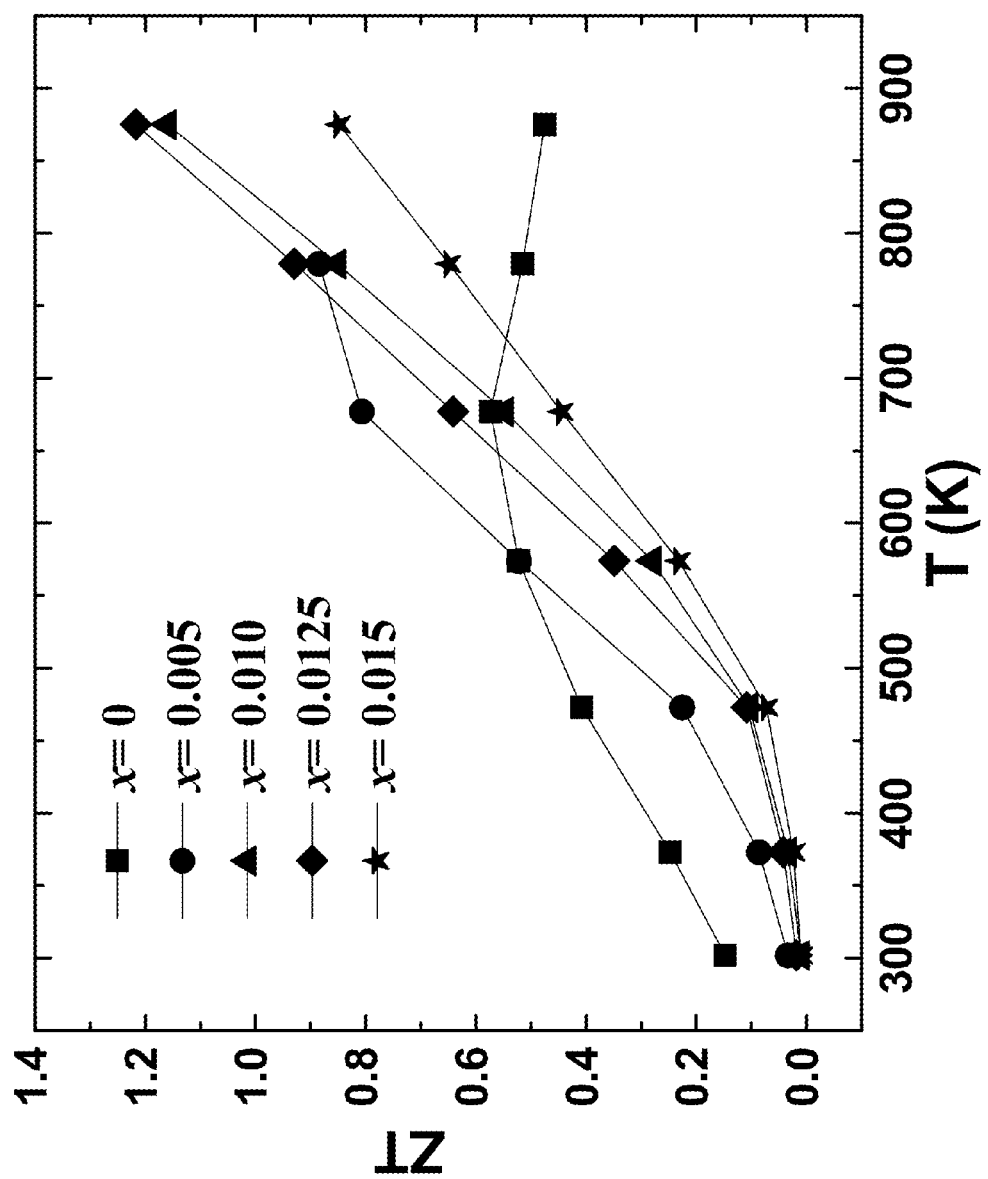
FIG. 13 presents a graph showing temperature dependence of the dimensionless figure-of-merit (ZT) in embodiment thermoelectric materials of the present disclosure.

FIG. 13 presents a graph showing temperature dependence of ZT for $K_xPb_{1-x}Se$ (x=0, 0.005, 0.010, 0.0125, and 0.015). As shown in FIG. 13, with the high start point of the electrical conductivity and the high Seebeck coefficient, maximum ZT value reached was about 1.2 at 873 K, but the average ZT is lower than that of K doped $K_xPb_{1-x}Te$. Both of the maximum ZT and the average ZT are comparable with Na doped PbSe.

Next, K doping in $PbTe_{1-y}Se_y$ was studied, with an aim to simultaneously increase the power factor and reduce the thermal conductivity to achieve higher ZT value. K concentration was fixed at 2% in Pb site based on the results of K in PbTe and PbSe, with different Se concentrations studied: $K_{0.02}Pb_{0.98}Te_{1-y}Se_y$ (y=0.15, 0.25, 0.75, 0.85, and 0.95).

Figure 14:
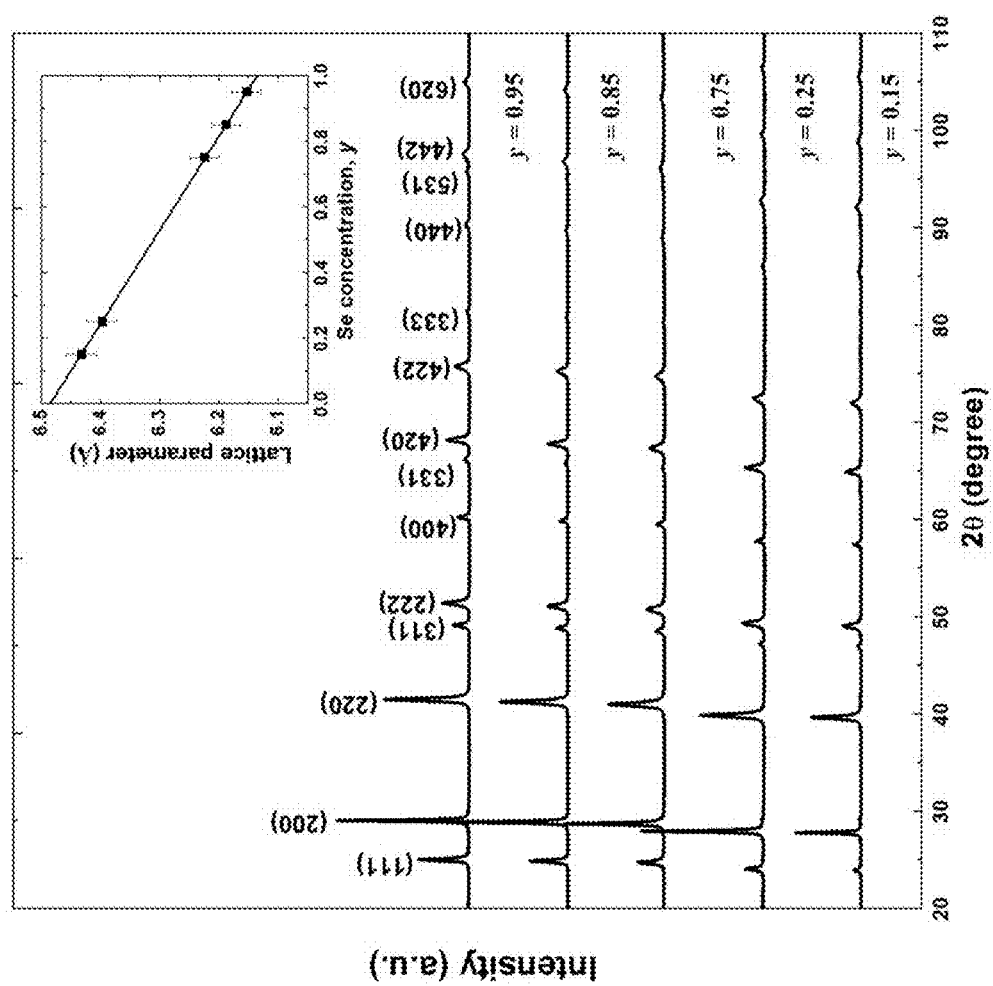
FIG. 14 presents XRD patterns of embodiment thermoelectric materials of the present disclosure.

FIG. 14 presents XRD patterns of $K_{0.02}Pb_{0.98}Te_{1-y}Se_y$ (y=0.15, 0.25, 0.75, 0.85, and 0.95). The inset shows the lattice parameter relation with the Se concentration in $K_{0.02}Pb_{0.98}Te_{1-y}Se_y$. All the X-Ray diffraction spectra presented in FIG. 14 show single phase with face-centered cubic rock salt structure. The peaks shift right with increasing concentration of Se because of the smaller lattice parameters. Good solid solution is confirmed by good fitting to the Vegard' law (inset of FIG. 14).

Figure 15A:
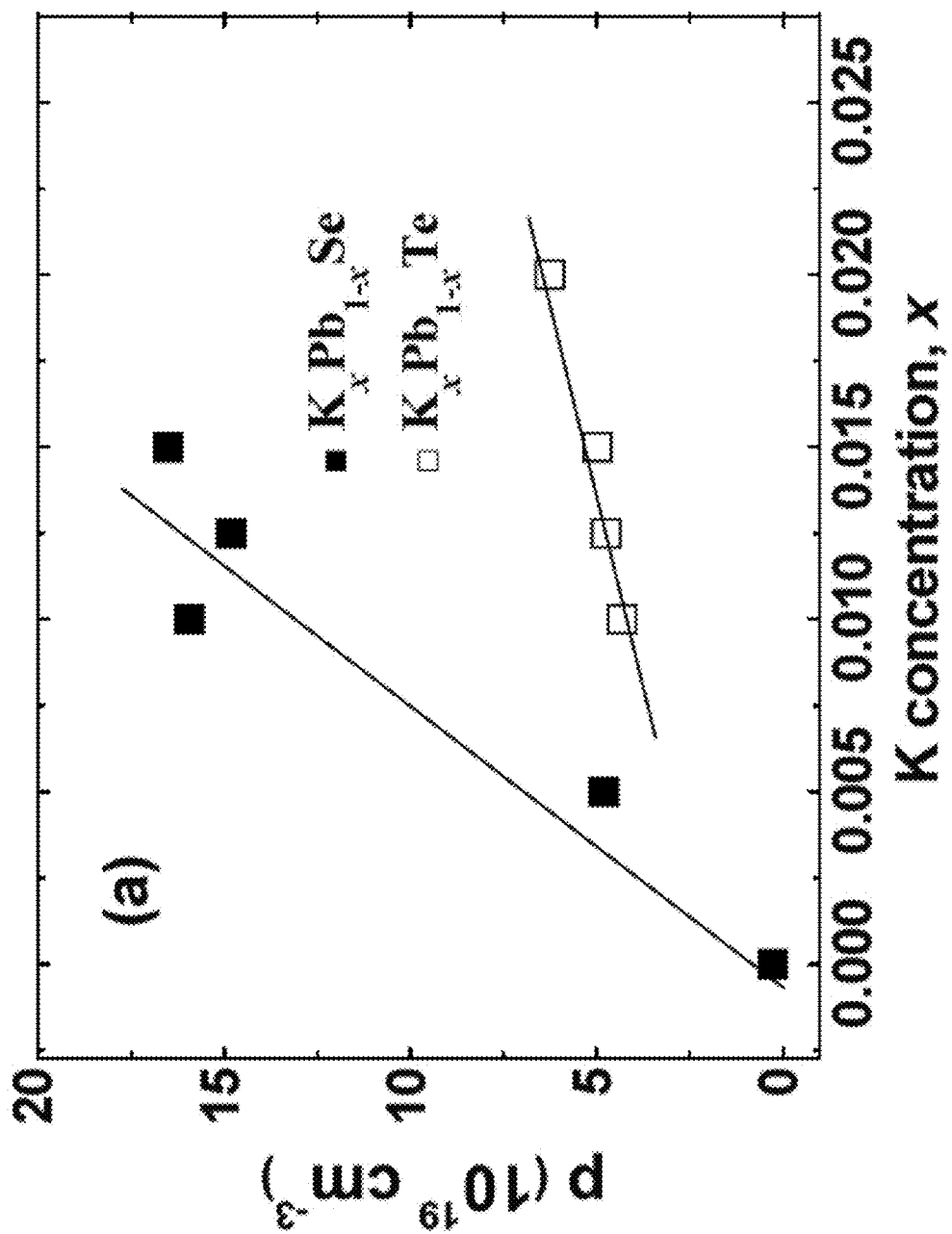
FIG. 15A presents a graph showing room temperature carrier concentration in embodiment thermoelectric materials of the present disclosure as a function of K concentration.
Figure 15B:
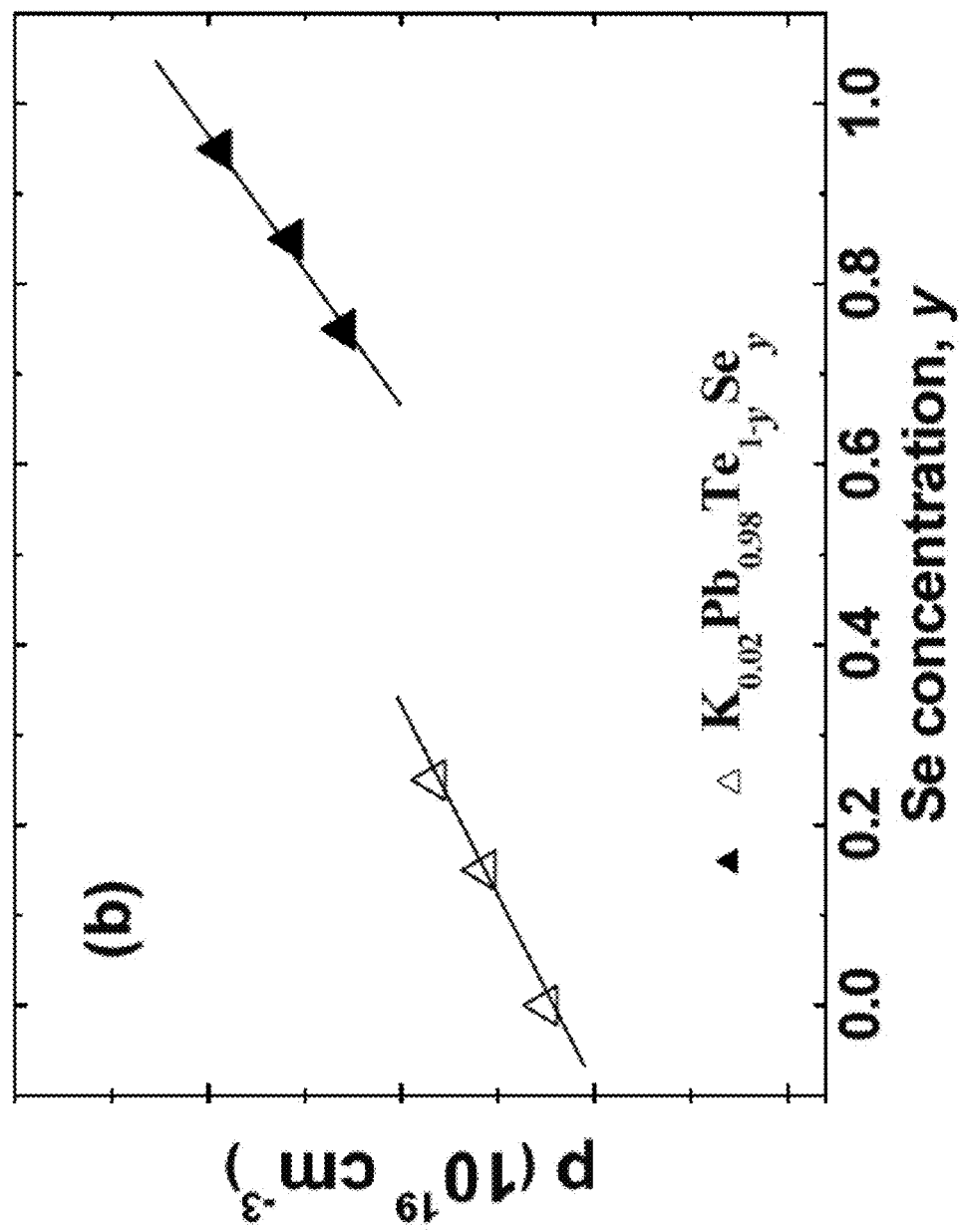
FIG. 15B presents a graph showing room temperature carrier concentration in embodiment thermoelectric materials of the present disclosure as a function of Se concentration.

FIG. 15A shows the room temperature carrier concentration as a function of K concentration. FIG. 15B shows the room temperature carrier concentration as a function Se concentration. With the help of Se, the carrier concentration was increased effectively from less than $6 \times 10^{19}$ cm$^{-3}$ in PbTe to the optimized concentration of $(8-15) \times 10^{19}$ cm$^{-3}$ for PbSe.

Together with the room temperature Seebeck coefficient, the Pisarenko plot of the solid solution samples is shown in FIG. 10 (filled triangles). Noticeable deviation of the Seebeck coefficient from the simple parabolic band model (dashed line) for $K_{0.02}Pb_{0.98}Te_{1-y}Se_y$ (y=0.15 and 0.25) supports the effects of heavy hole bands. Owing to the relative small effective mass of PbSe, the Seebeck coefficients are lower than those of K doped PbTe (filled circles). For $K_{0.02}Pb_{0.98}Te_{1-y}Se_y$ (y=0.75, 0.85, and 0.95), more features come from K doped PbSe, which agrees well with the simple parabolic band model (solid line) at room temperature. As temperature increases, two bands start to converge, which follows, $$\Delta E_{C-L} = 0.18 + (4T/10000) - 0.04y$$

$$\Delta E_{C-\Sigma} = 0.36 + 0.10y \quad (5)$$

where y is the concentration of Se. It has been concluded that the convergence of the electronic bands can provide more benefit for the enhancement of Seebeck coefficient from double bands. However, L band will move gradually below Σ band at T>$T_{cvg}$=450 K and depart from the convergence when y=0 (PbTe).

Figure 16A:
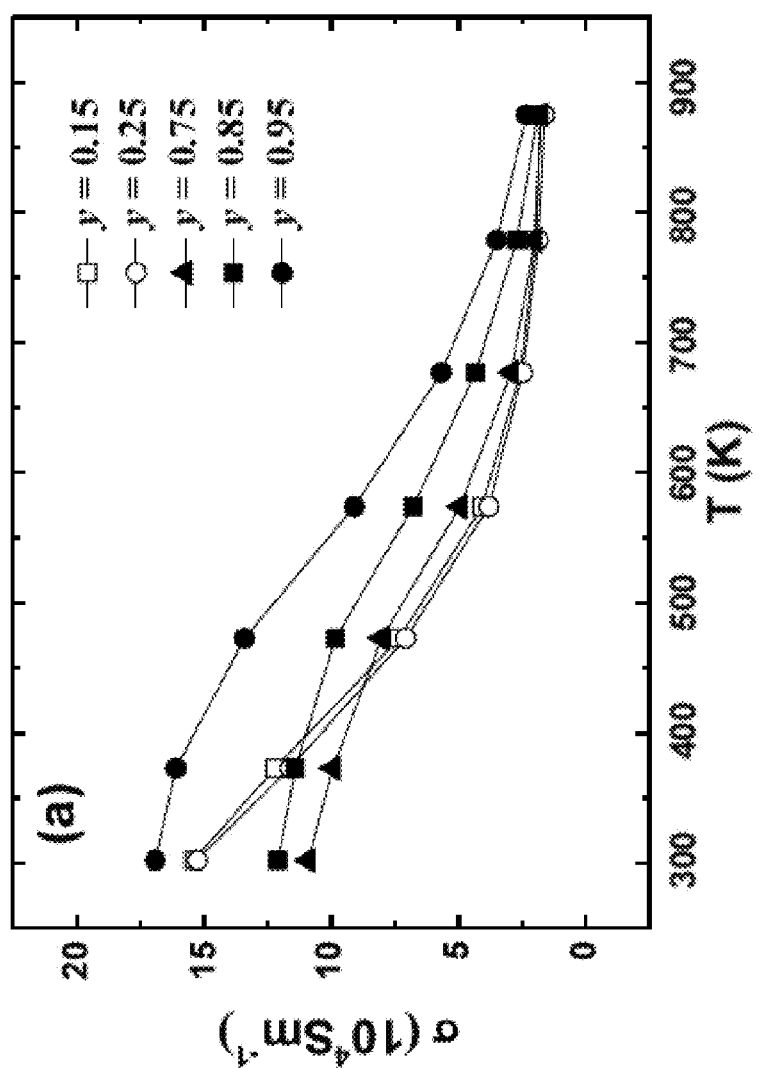
FIG. 16A presents a graph showing temperature dependence of the electrical conductivity of embodiment thermoelectric materials of the present disclosure.
Figure 16B:
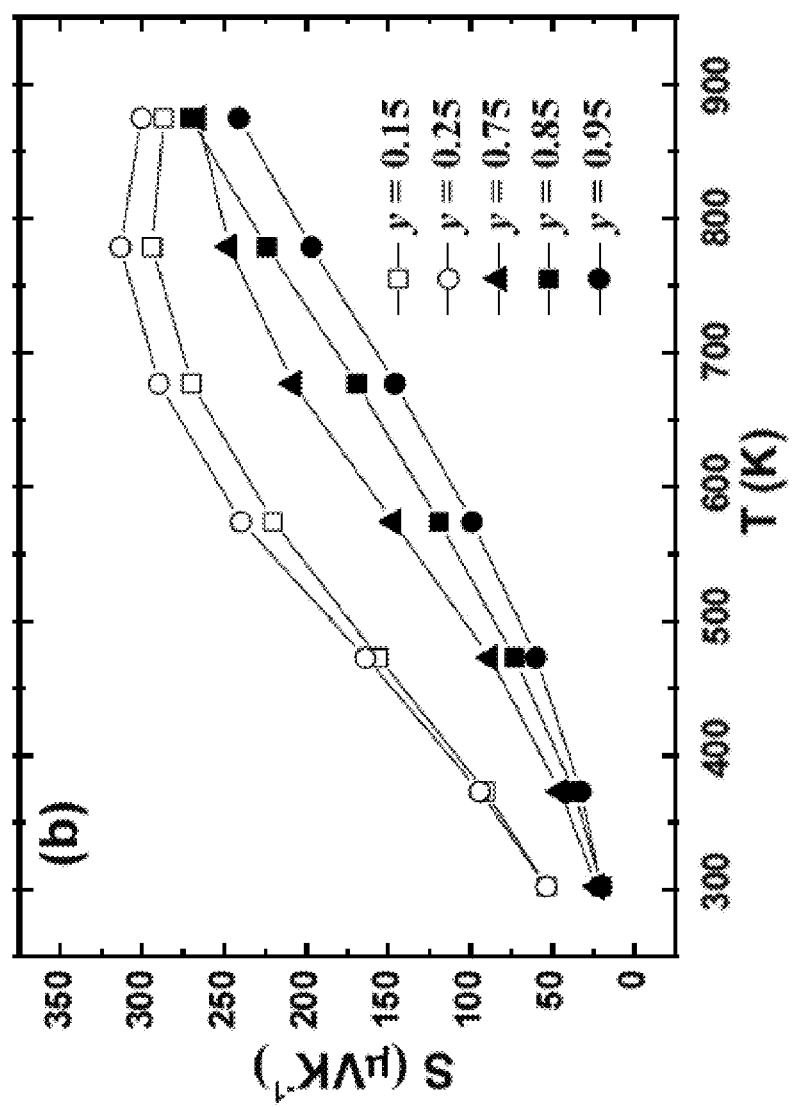
FIG. 16B presents a graph showing temperature dependence of the Seebeck coefficient of embodiment thermoelectric materials of the present disclosure.
Figure 16C:
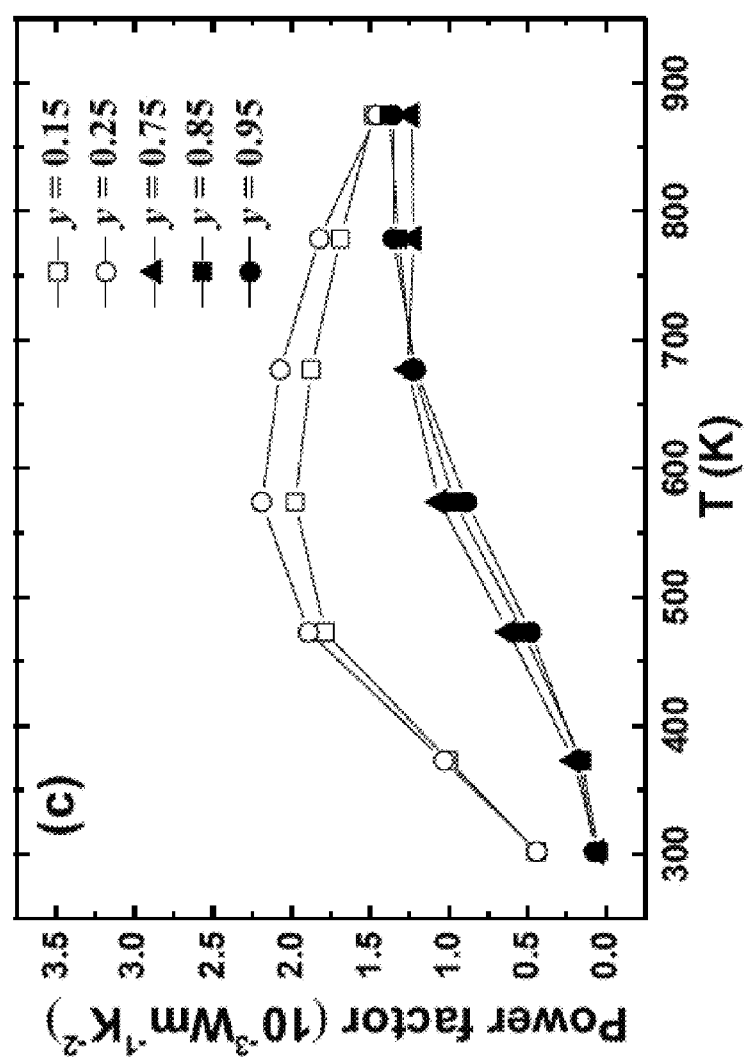
FIG. 16C presents a graph showing temperature dependence of the power factor of embodiment thermoelectric materials of the present disclosure.

FIG. 16A, FIG. 16B and FIG. 16C show temperature dependence of thermal properties of $K_{0.02}Pb_{0.98}Te_{1-y}Se_y$ (y=0.15, 0.25, 0.75, 0.85, and 0.95). FIG. 16A presents a graph showing temperature dependence of the electrical conductivity of $K_{0.02}Pb_{0.98}Te_{1-y}Se_y$ (y=0.15, 0.25, 0.75, 0.85, and 0.95). FIG. 16B presents a graph showing temperature dependence of the Seebeck coefficient of $K_{0.02}Pb_{0.98}Te_{1-y}Se_y$ (y=0.15, 0.25, 0.75, 0.85, and 0.95). FIG. 16C presents a graph showing temperature dependence of the power factor of $K_{0.02}Pb_{0.98}Te_{1-y}Se_y$ (y=0.15, 0.25, 0.75, 0.85, and 0.95). As demonstrated in FIG. 16B, use of Se results in the most optimized Seebeck coefficient at high temperature. With increase of Se, the temperature for highest Seebeck coefficient increases. The highest Seebeck coefficient is about 320 µVK$^{-1}$ at 775 K, much higher than that in Na doped $PbTe_{1-y}Se_y$ of about 220 µVK$^{-1}$ at 775 K. The successfully improved carrier concentration compensates the loss in the carrier mobility for the increased scattering from the electrons, which keeps the electrical conductivity the same at low temperature, as shown in FIG. 16A. The decrease of the electrical conductivity is slowed down with temperature, giving a smaller δ in Table 1 in FIG. 7. As a result, the power factor is enhanced at high temperature as shown in FIG. 16C.

Figure 17A:
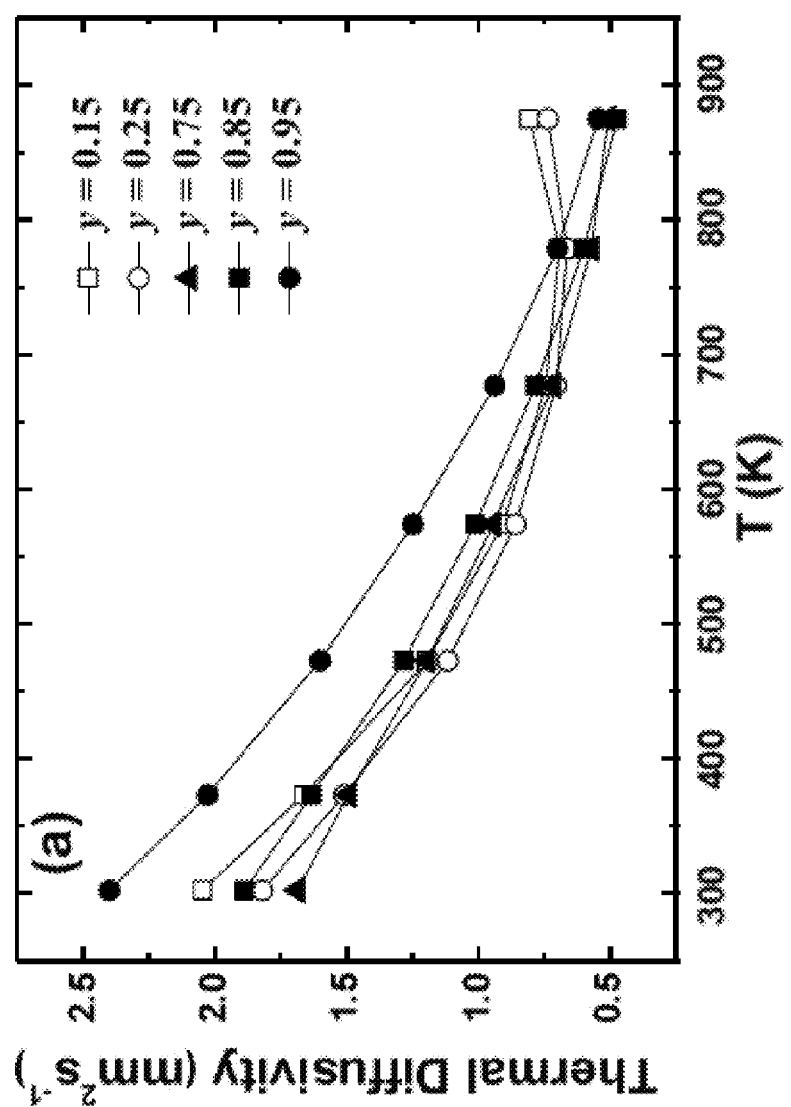
FIG. 17A presents a graph showing temperature dependence of the thermal diffusivity of embodiment thermoelectric materials of the present disclosure.
Figure 17B:
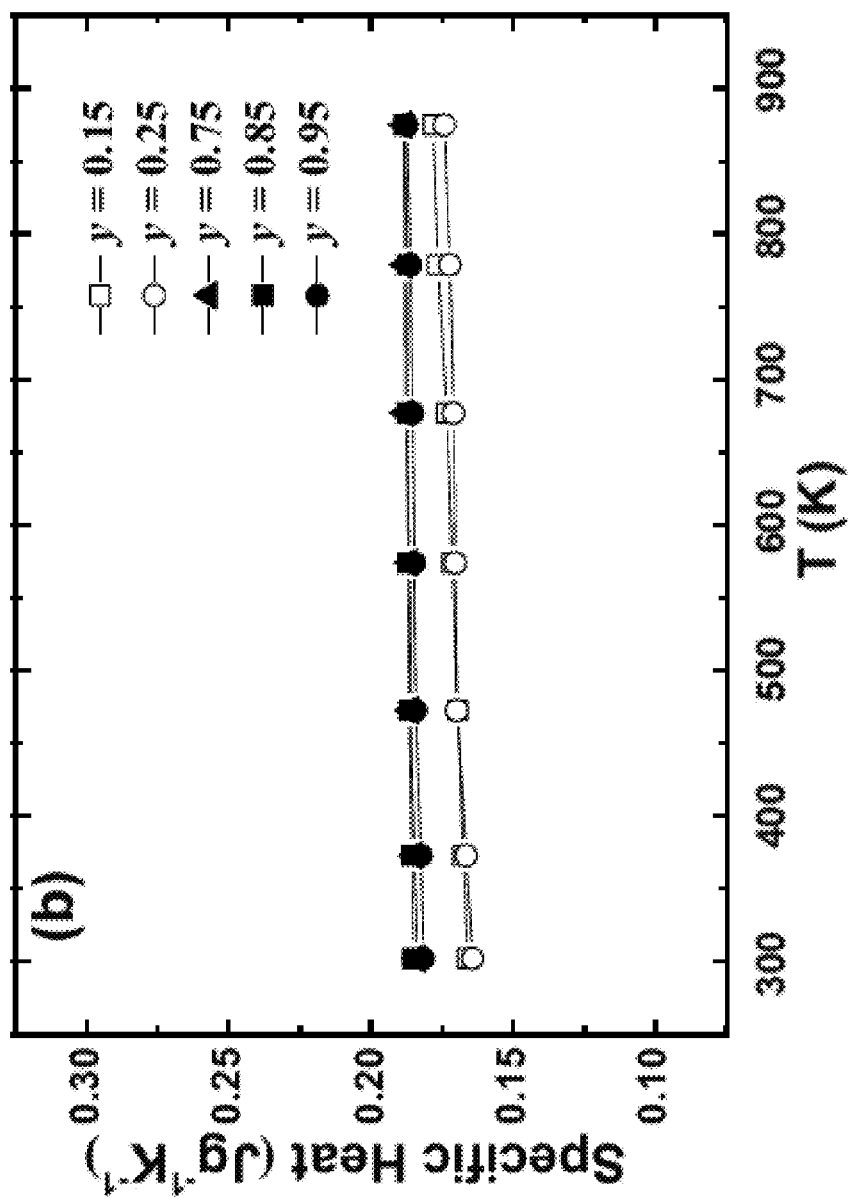
FIG. 17B presents a graph showing temperature dependence of the specific heat of embodiment thermoelectric materials of the present disclosure.
Figure 17C:
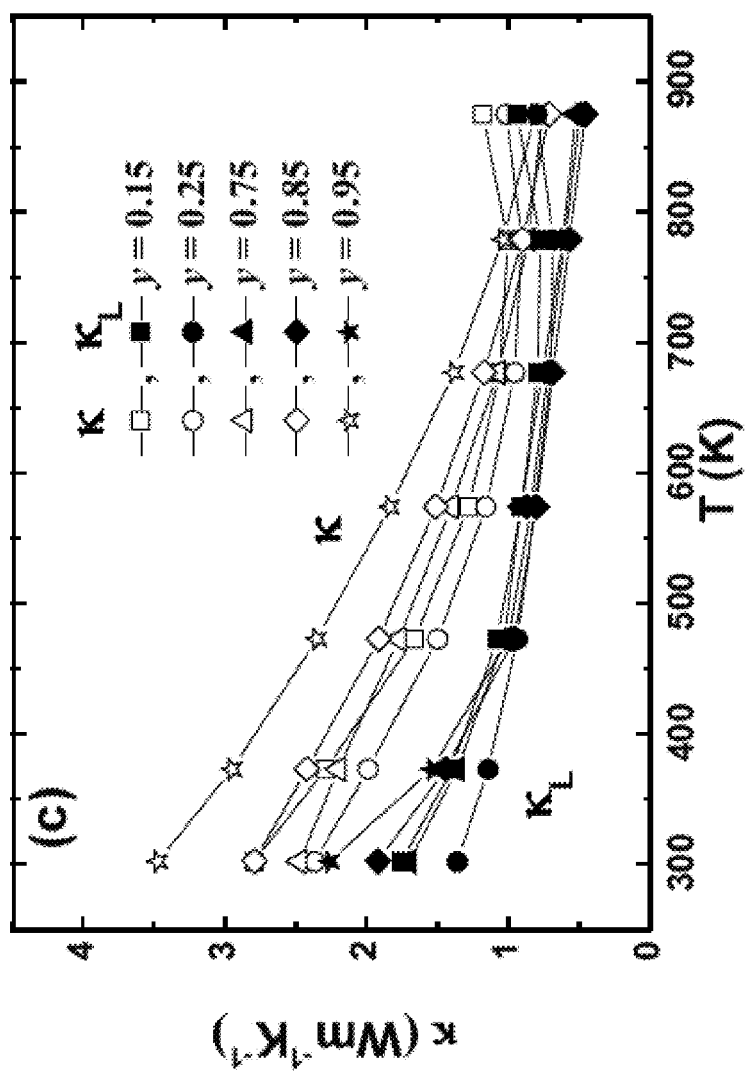
FIG. 17C presents a graph showing temperature dependence of the total thermal conductivity and lattice thermal conductivity of embodiment thermoelectric materials of the present disclosure.

Moreover, Se also acts to decrease the lattice thermal conductivity by alloying scattering when it is used together with Te. FIG. 17A presents a graph showing temperature dependence of the thermal diffusivity for $K_{0.02}Pb_{0.98}Te_{1-y}Se_y$ (y=0.15, 0.25, 0.75, 0.85, and 0.95). FIG. 17B presents a graph showing temperature dependence of the specific heat for $K_{0.02}Pb_{0.98}Te_{1-y}Se_y$ (y=0.15, 0.25, 0.75, 0.85, and 0.95). FIG. 17C presents a graph showing temperature dependence of the total thermal conductivity and lattice thermal conductivity for $K_{0.02}Pb_{0.98}Te_{1-y}Se_y$ (y=0.15, 0.25, 0.75, 0.85, and 0.95).

Figure 18:
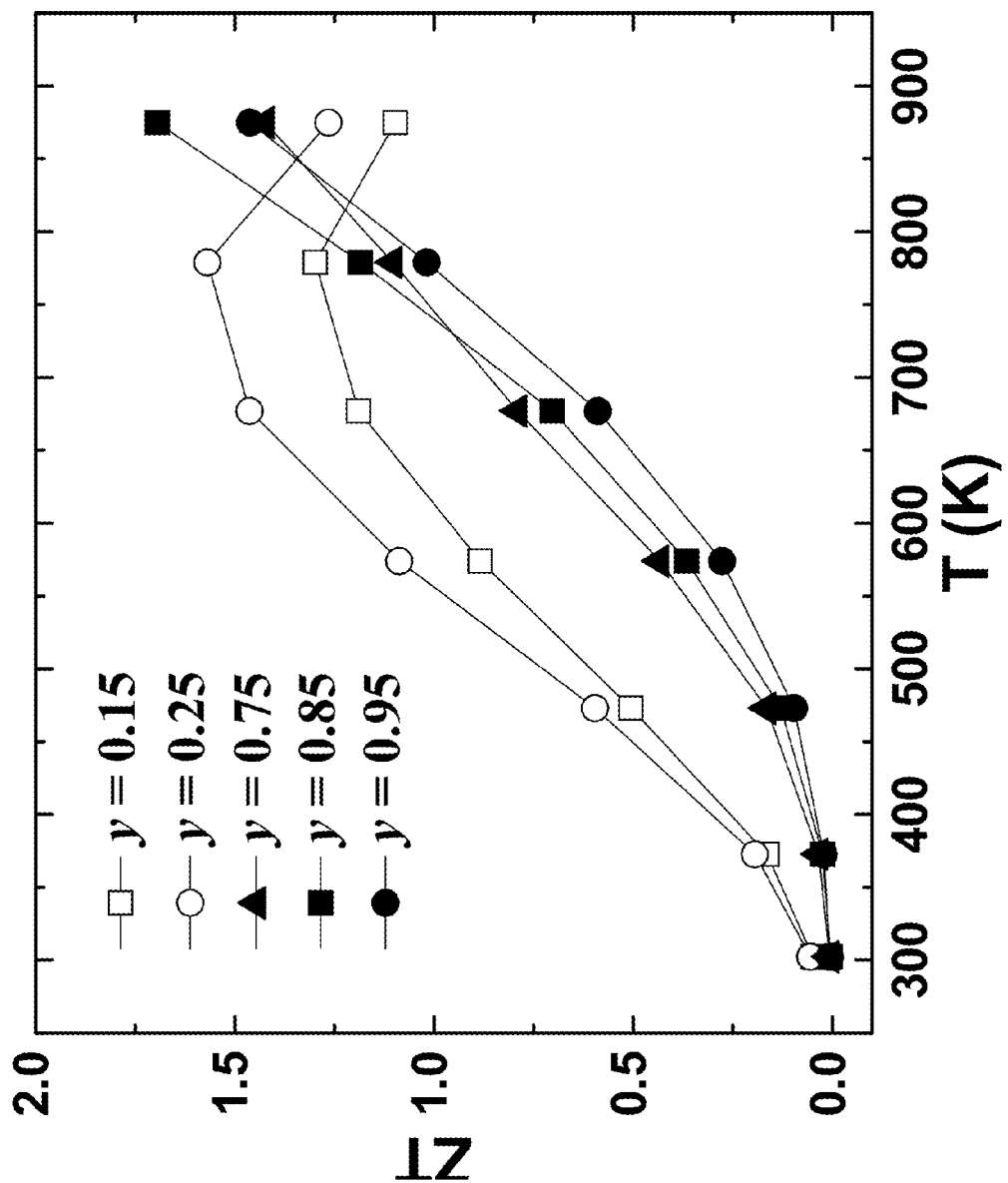
FIG. 18 presents a graph showing temperature dependence of the dimensionless figure-of-merit (ZT) of embodiment thermoelectric materials of the present disclosure.

FIG. 18 presents a graph showing temperature dependence of the dimensionless figure-of-merit (ZT) of $K_{0.02}Pb_{0.98}Te_{1-y}Se_y$ (y=0.15, 0.25, 0.75, 0.85, and 0.95). In reference to FIG. 18, the peak ZT of $K_{0.02}Pb_{0.98}Te_{0.15}Se_{0.85}$ is about 1.7 at 873 K in comparison with about 1.6 in $K_{0.02}Pb_{0.98}Te_{0.75}Se_{0.25}$ at about 773 K. Te-rich composition is more promising for any applications below 873 K since the average ZTs are much higher.

In some embodiments, lead telluride/selenide based materials with improved figure of merit and mechanical properties are provided. In some embodiments, the lead telluride/selenide based materials of the present disclosure are p-type thermoelectric materials formed by adding sodium (Na), silicon (Si) or both to thallium doped lead telluride materials. In some embodiments, the lead telluride/selenide based materials of the present disclosure are formed by doping lead telluride/selenides with potassium.

In some embodiments, a method for producing thermoelectric materials includes producing nanopowders of one or more starting materials by grinding of the one or more starting materials, together or separately, and consolidating the as-milled nanopowders via a hot pressing method. In some embodiments, nanopowders can be produced by subjecting the starting materials to high-energy ball milling. In some embodiments, nanopowders can be produced by hand milling the starting materials.

In some embodiments, a thermoelectric material has a general formula $Tl_aPb_{1-a}Te_{1-x}Se_xSi_yNa_z$, where a has a value between about 0 and about 0.04, x has a value between about 0 and about 1, y has a value between about 0 and about 0.05, and z has a value between about 0 and about 0.03.

In some embodiments, a thermoelectric material has a general formula $K_xPb1_{-x}Te_{1-y}Se_y$, where x has a value between about 0 and about 0.03 and y has a value between about 0 and about 1.

In some embodiments, a method of synthesis of a thermoelectric material includes generating a plurality of nanoparticles from a starting material comprising lead, tellurium, selenium and one or more dopants selected from the group consisting of sodium, silicon or thallium in sufficient amounts according to a general formula $Tl_aPb_{1-a}Te_{1-x}Se_xSi_yNa_z$, where a has a value between about 0 and about 0.04, x has a value between about 0 and about 1, y has a value between about 0 and about 0.05, and z has a value between about 0 and about 0.03, and consolidating the nanoparticles at elevated pressure and temperature.

In some embodiments, a method of synthesis of a thermoelectric material includes generating a plurality of nanoparticles from a starting material comprising lead, tellurium, selenium and potassium in sufficient amounts according to a general formula $K_xPb1_{-x}Te_{1-y}Se_y$, where x has a value between about 0 and about 0.03 and y has a value between about 0 and about 1, and consolidating the nanoparticles at elevated pressure and temperature.

All patents, patent applications, and published references cited herein are hereby incorporated by reference in their entirety. While the methods of the present disclosure have been described in connection with the specific embodiments thereof, it will be understood that it is capable of further modification. Furthermore, this application is intended to cover any variations, uses, or adaptations of the methods of the present disclosure, including such departures from the present disclosure as come within known or customary practice in the art to which the methods of the present disclosure pertain.

What is claimed is:

1. A thermoelectric material having a general formula $Tl_{0.02}Pb_{0.98}Te_{1-x}Se_xSi_{0.02}Na_z$, where
   x has a value from 0 to 1,
   and
   z has a value of 0.015, 0.020, or 0.025.

2. The thermoelectric material of claim 1 wherein having a figure of merit of about 1.5 or higher at about 770K.

3. The thermoelectric material of claim 1 having a formula $Tl_{0.02}Pb_{0.98}TeSi_{0.02}Na_z$, where
   z has a value of 0.015, 0.020 or 0.025.

4. The thermoelectric material of claim 1, where x has a value of 0 or 1.

5. A thermoelectric material having a stoichiometric formula $Tl_{0.02}Pb_{0.98}TeSi_{0.02}Na_{0.02}$.

6. A method of synthesis of a thermoelectric material comprising:
   generating a plurality of nanoparticles from a starting material comprising lead, tellurium, selenium and one or more dopants selected from the group consisting of sodium, silicon or thallium in sufficient amounts according to a general formula $Tl_{0.02}Pb_{0.98}Te_{1-x}Se_xSi_{0.02}Na_z$, where
   x has a value from 0 to 1,
   and
   z has a value of 0.015, 0.020 or 0.025; and
   consolidating the nanoparticles at elevated pressure and temperature.

7. The method of claim 6 wherein the plurality of nanoparticles are generated by ball milling and consolidated by hot pressing.

* * * * *